(12) United States Patent
   Kandori

(10) Patent No.: US 11,137,302 B2
(45) Date of Patent: Oct. 5, 2021

(54) COMPOUND SENSOR

(71) Applicant: CANON KABUSHIKI KAISHA, Tokyo (JP)

(72) Inventor: Atsushi Kandori, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 349 days.

(21) Appl. No.: 16/108,389

(22) Filed: Aug. 22, 2018

(65) Prior Publication Data
US 2019/0064013 A1 Feb. 28, 2019

(30) Foreign Application Priority Data

Aug. 25, 2017 (JP) .............................. JP2017-162617

(51) Int. Cl.
| | | |
|---|---|---|
| *G01L 1/25* | (2006.01) | |
| *G01L 11/06* | (2006.01) | |
| *G01L 9/00* | (2006.01) | |
| *G01L 9/08* | (2006.01) | |
| *B25J 19/02* | (2006.01) | |
| *G01L 1/16* | (2006.01) | |
| *G01L 5/22* | (2006.01) | |
| *B25J 13/08* | (2006.01) | |
| *H01L 41/113* | (2006.01) | |
| *G01L 1/14* | (2006.01) | |

(52) U.S. Cl.
CPC .............. *G01L 1/255* (2013.01); *B25J 13/081* (2013.01); *B25J 13/084* (2013.01); *B25J 13/086* (2013.01); *B25J 19/026* (2013.01); *G01L 1/146* (2013.01); *G01L 1/162* (2013.01); *G01L 5/228* (2013.01); *G01L 9/0022* (2013.01); *G01L 9/08* (2013.01); *G01L 11/06* (2013.01); *H01L 41/1132* (2013.01)

(58) Field of Classification Search
CPC ......... G01L 1/255; G01L 1/146; G01L 11/06; G01L 9/0022; G01L 9/08; G01L 1/162; G01L 5/228; B25J 13/086; B25J 13/084; B25J 19/026; B25J 13/081; H01L 41/1132
See application file for complete search history.

(56) References Cited

U.S. PATENT DOCUMENTS

| | | | |
|---|---|---|---|
| 2010/0017710 A1* | 1/2010 | Kim ...................... | G06F 3/0488 715/702 |
| 2014/0214209 A1 | 7/2014 | Sugiura | |
| 2016/0158942 A1* | 6/2016 | Augenbraun .......... | B25J 9/1694 700/253 |
| 2017/0356812 A1* | 12/2017 | Madden .............. | G06F 3/04166 |
| 2018/0032209 A1* | 2/2018 | Suzuki ................ | G06F 3/04144 |

(Continued)

FOREIGN PATENT DOCUMENTS

| | | |
|---|---|---|
| JP | 60-243582 A | 12/1985 |
| JP | 2011-224695 A | 11/2011 |

(Continued)

*Primary Examiner* — Daryl C Pope
(74) *Attorney, Agent, or Firm* — Canon U.S.A., Inc. IP Division

(57) ABSTRACT

A compound sensor that is capable of being used with robotics is provided such that the compound sensor includes a distance measurement unit and a pressure measurement unit. Further, a contact detection unit, which is dedicated to performing a detection when a measurement target contacts with a surface of the sensor is included.

9 Claims, 20 Drawing Sheets

(56) References Cited

U.S. PATENT DOCUMENTS

| | | | | |
|---|---|---|---|---|
| 2018/0088722 A1* | 3/2018 | Kim | ............... | G02F 1/1343 |
| 2018/0143718 A1* | 5/2018 | Kim | ............... | G06F 3/044 |
| 2018/0188874 A1* | 7/2018 | Cho | ............... | G06F 3/0447 |
| 2018/0312393 A1* | 11/2018 | Abbasi Gavarti | .... | B81B 3/0021 |
| 2018/0328799 A1* | 11/2018 | Park | ............... | G01L 5/0038 |
| 2019/0212844 A1* | 7/2019 | Leigh | ............... | G06F 3/0443 |

FOREIGN PATENT DOCUMENTS

| | | |
|---|---|---|
| JP | 2012-141256 A | 7/2012 |
| JP | 2012-215533 A | 11/2012 |
| JP | 2013-096870 A | 5/2013 |

\* cited by examiner

COMPOUND SENSOR

BACKGROUND OF THE INVENTION

Field of the Invention

The present invention relates to a compound sensor including a function as a proximity sensor for detecting a distance from a nearby target by using an ultrasonic wave and a function as a tactile sensor for detecting a contact pressure from the target.

Description of the Related Art

When a robot hand tries to hold an object, a control is executed based on image information captured by a camera or the like. However, when the robot hand approaches to the object or touches the object, the information obtained from the image information from the camera is limited. Thus, to compensate the lack of information, a configuration that a sensor is provided at an end portion of the robot hand has been proposed.

When a sensor that combines a proximity sensor and a tactile sensor is used as the sensor provided at the end portion of the robot hand, further detailed information related to the object can be obtained and more specific control of the robot hand can be performed.

In the proximity sensor, a distance is measured by transmitting an ultrasonic wave to a measurement target (the object) and receiving the ultrasonic wave reflected and returned from the measurement target. Thus, there has been a problem that, when the distance from the measurement target is too short, the interval between the transmission and the reception becomes too short and it is difficult to detect the distance. Thus, with a configuration of performing a contact determination by using a distance, which is described in Japanese Patent Laid-Open No. 2012-141256, it is difficult to determine whether the distance from the target is significantly short or there is a contact with the target when the distance is too short.

On the other hand, in the tactile sensor, to detect a pressure from the target, a certain dynamic range needs to be maintained. Thus, with a configuration that a sensor for pressure measurement is used to perform a contact determination, which is described in Japanese Patent Laid-Open No. 2012-215533, it is difficult to accurately detect a change in an imperceptible pressure in a contacting region.

In this manner, with a sensor combining a proximity sensor for detecting a distance from a nearby target by using an ultrasonic wave and a tactile sensor for detecting a contact strength with the target, there may be a dead zone of the sensor in a region where the target and the sensor contact with each other. Thus, it is difficult to accurately recognize a contact between the target and the sensor.

SUMMARY OF THE INVENTION

The present embodiment has an object to provide a compound sensor including a function as a proximity sensor and a function as a tactile sensor, which can accurately recognize a contact with a measurement target.

The compound sensor according to the present embodiment is a compound sensor including a distance measurement unit configured to measure a distance from a measurement target by transmitting an ultrasonic wave and receiving the ultrasonic wave returned from the measurement target, a pressure measurement unit configured to measure a pressure applied from the measurement target, and a contact detection unit configured to detect a presence of a contact with the measurement target.

Further features will become apparent from the following description of exemplary embodiments (with reference to the attached drawings).

DESCRIPTION OF THE EMBODIMENTS

According to the present embodiment, in addition to a distance measurement unit (a proximity sensor) and a pressure measurement unit (a tactile sensor), a contact detection unit (a contact sensor) dedicated to performing a detection when a target contacts with a surface of the sensor is included.

In the following, embodiments will be described with reference to the drawings. It is noted that the embodiments are not limited to these embodiments and various modifications and changes may be made within the scope.

First Embodiment

Figure 1:
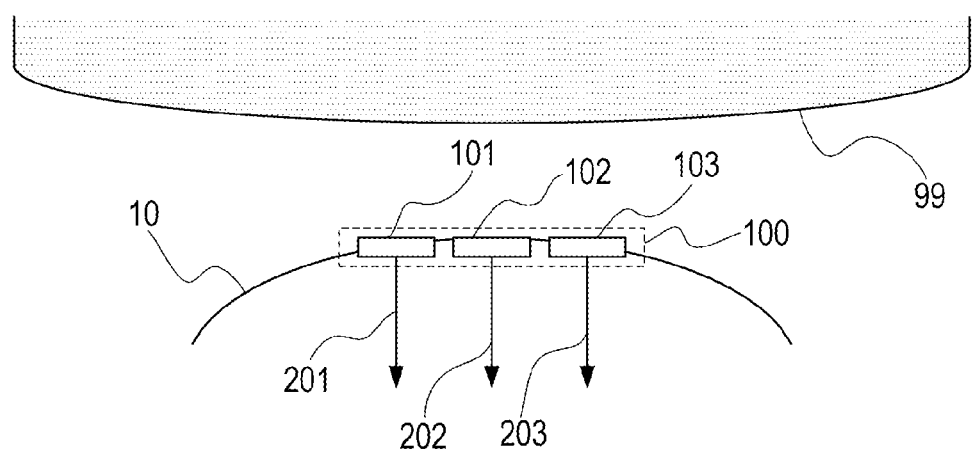
FIG. 1 is a schematic view for explaining a compound sensor.

A compound sensor according to an embodiment will be described with reference to FIG. 1. FIG. 1 is a schematic view illustrating the compound sensor including a proximity and a contact. In FIG. 1, 10 represents a robot hand end portion, 100 represents a compound sensor, 101 represents a distance measurement unit (a proximity sensor), 102 represents a pressure measurement unit (a tactile sensor), 103 represents a contact detection unit (a contact sensor), 99 represents a target (an object), 201 represents a distance measurement signal, 202 represents a pressure measurement signal, and 203 represents a contact detection signal.

The present embodiment is characterized in that each compound sensor 100 includes the contact detection unit 103 dedicated to detecting a contact with a target, in addition to the distance measurement unit 101 and pressure measurement unit 102.

The distance measurement unit 101 has a function for generating an ultrasonic wave and transmitting the ultrasonic wave toward the target 99. The ultrasonic wave irradiated to the target 99 is reflected on the surface of the target with an acoustic impedance difference on an interface of the target. A part of the ultrasonic wave reflected by the target 99 returns to the distance measurement unit 101. The distance measurement unit 101 has a function for receiving the returned ultrasonic wave and measuring a period of time (time interval) from the time of transmission and the time of reception. Since the time interval t is from the transmission to reception corresponding to a length of a path that the ultrasonic wave propagates, the distance to the target can be measured by measuring the time interval t. The distance measurement unit 101 has a function for calculating the distance to the target based on the time interval t and outputting a distance measurement signal 201.

Here, since the generated ultrasonic wave has a constant time duration, it becomes difficult to measure the distance when the time interval becomes equal to or smaller than the duration. Further, the measurable time interval may sometimes be extended because of a noise caused by a drive signal used in transmission and ringing characteristics of a transmission/reception unit.

In a case where the distance measurement unit 101 is used in a robot hand, it is preferable to have a specification that allows to measure a distance shorter than a several centimeters. Further, as an ultrasonic wave transmission/reception unit in a distance measurement unit 101, any device may be used as long as the transmission and reception of the ultrasonic wave can be executed and, for example, it may be easily realized by using a piezoelectric body. Further, a unit for measuring a time interval t of the ultrasonic wave transmission and reception and outputting a signal may be easily realized with a microcomputer or a combination of an analog circuit and a logic circuit.

The pressure measurement unit 102 has a function to output the pressure measurement signal 202 according to a pressure level when contacting with the target. As the pressure measurement unit 102, any device which can measure the pressure applied from the target 99 can be used and, for example, it can be easily realized by using a piezoelectric body. When the compound sensor is provided to a robot hand end portion 10 or the like and used to hold an object, it is needed to accurately recognize a degree of a grip force (pressure level) applied from the hand to the object and control the grip force to be applied in a most preferable manner. Thus, the measurable range of the pressure needs to be a wide dynamic range and a sensitivity setting of the pressure measurement unit 102 needs to be set based on a maximum grip force. Therefore, in the pressure measurement unit 102, resolution of detecting an imperceptible pressure cannot be made too high.

The contact detection unit 103 detects a contact between the target 99 and sensor 100 and outputs a contact detection signal 203. To only detect whether there is a contact between the target 99 and the sensor 100, the contact detection unit 103 has a quite high sensitivity for a pressure in a beginning of a contact by an object. On the other hand, when the pressure becomes a little larger, detected signals are saturated and the sensitivity characteristics become a level which cannot be used in normal pressure measurement. In other words, since the sensor is saturated, the contact detection unit 103 does not perform a detecting operation when a large pressure is applied after a contact with the object. In this manner, the smaller pressure side of a pressure detection range of the pressure measurement unit 102 and the lager pressure side of a pressure detection range of the contact detection unit 103 partially overlap so that the pressure detection ranges are complemented by each other.

The contact detection unit 103 may be realized with any device, which can output a contact detection signal 203 when a target 99 contacts with a surface of the sensor 100. More specifically, the contact detection unit 103 may be easily realized by providing a configuration that includes a membrane, which is a thin film, and detects an imperceptible distortion of the membrane when an imperceptible pressure is applied to the membrane.

As described above, the present embodiment has a characteristic that the pressure measurement unit 102 having a detection sensitivity range and the contact detection unit 103 having a different detection sensitivity range are separately provided. Thus, in addition to the distance measurement between the target 99 and the sensor 100 before contacting with each other and a pressure applied from the target 99 to the sensor 100 after contacting with each other, it can be detected whether the target 99 has contacted with the surface of the sensor 100.

As described above, according to the present embodiment, a compound sensor having a proximity sense and a tactile sense, which can accurately recognize a contact with a target, can be provided.

Figure 2A:
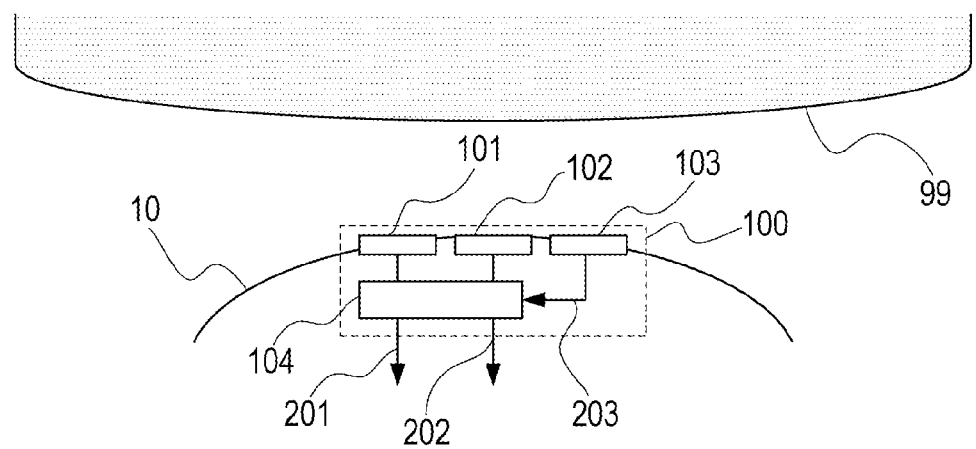
FIGS. 2A and 2B are schematic views for explaining another example structure of a first embodiment.

Other example structures related to the present embodiment will be described with reference to FIGS. 2A to 10. In FIG. 2A, an output signal switching unit 104 is included. In the output signal switching unit 104, based on the contact detection signal 203 obtained by the contact detection unit 103, the distance detection signal 201 and pressure measurement signal 202 are switched as a non-output signal and output as an output signal 203. More specifically, when the contact detection signal 203 has detected a contact, the distance detection signal 201 is made in a non-output signal state and the pressure measurement signal 202 is output as the output signal 203. On the other hand, when the contact detection signal 203 has detected a non-contact condition, the distance detection signal 201 is output as the output signal 203 and the pressure measurement signal 202 is made in a non-output signal state.

With a configuration illustrated in FIG. 2A, since a contact/non-contact condition can be determined only by referring to the distance detection signal 201 and pressure measurement signal 202, a process on the distance detection signal 201 and pressure measurement signal 202 based on the contact detection signal 203 is not needed to perform outside and a process on the output signal from the sensor can be reduced in the system side.

Figure 2B:
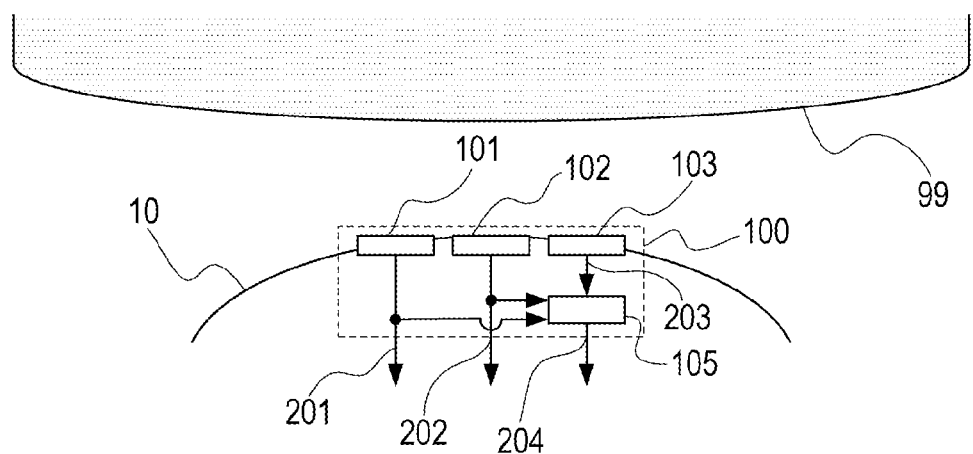

Another example structure will be described with reference to FIG. 2B. In FIG. 2B, it is characterized that the distance detection signal 201 and pressure measurement signal 202 are used for the detection of a contact, in addition to the detection in the contact detection unit 103. More specifically, in a case where the distance detection signal 201 is a minimum detectable distance, the pressure measurement signal 202 is a minimum detectable pressure, and the contact detection unit 103 detects a contact, a contact determination signal 204 is output from a contact determination unit 105. With the configuration illustrated in FIG. 2B, since a contact is detected based on a plurality of pieces of information, a false detection of a contact can be reduced and a contact with a target can be surely detected.

Figure 3:
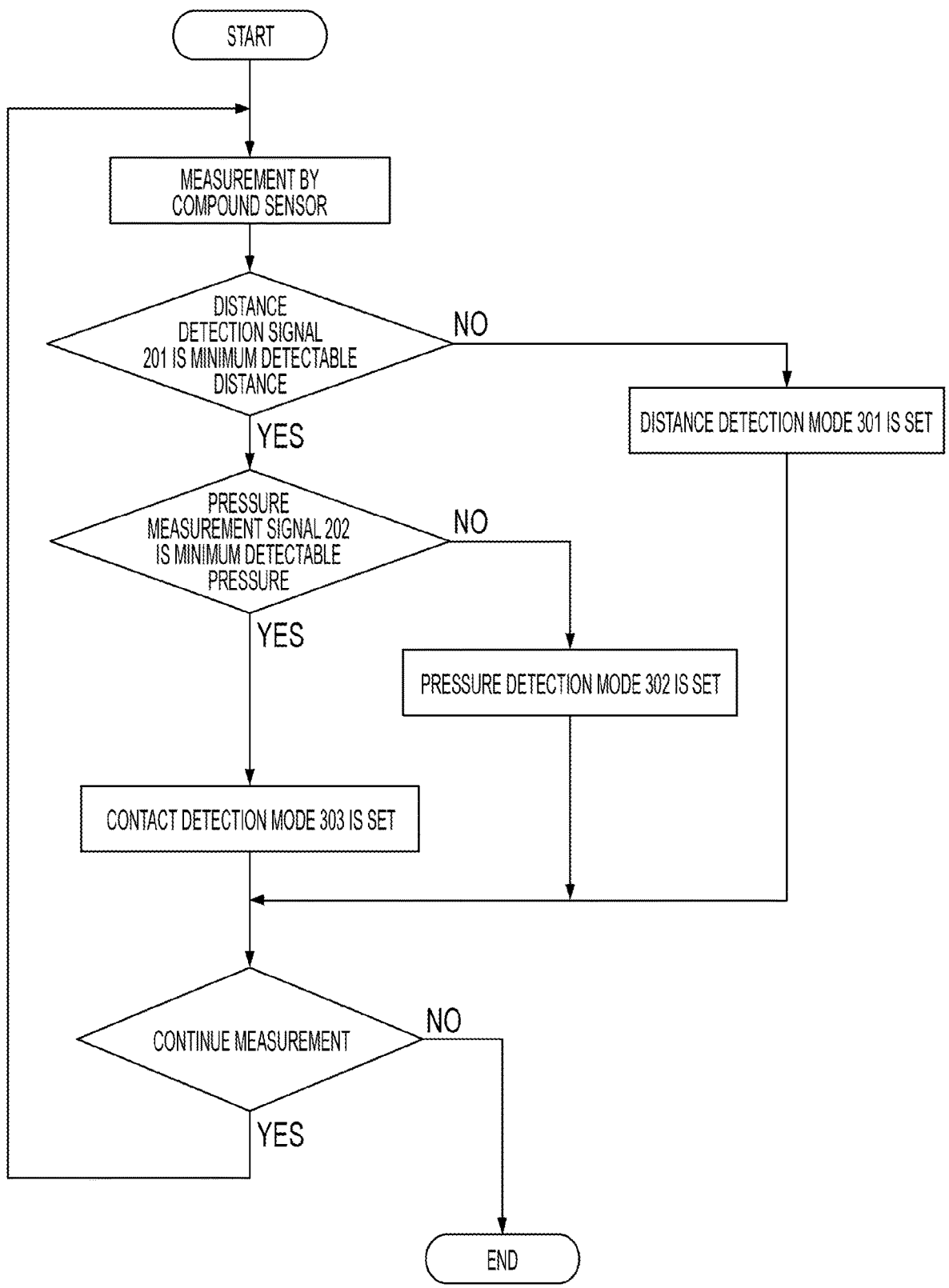
FIG. 3 is a schematic view for explaining another example structure of the first embodiment.
Figure 4:
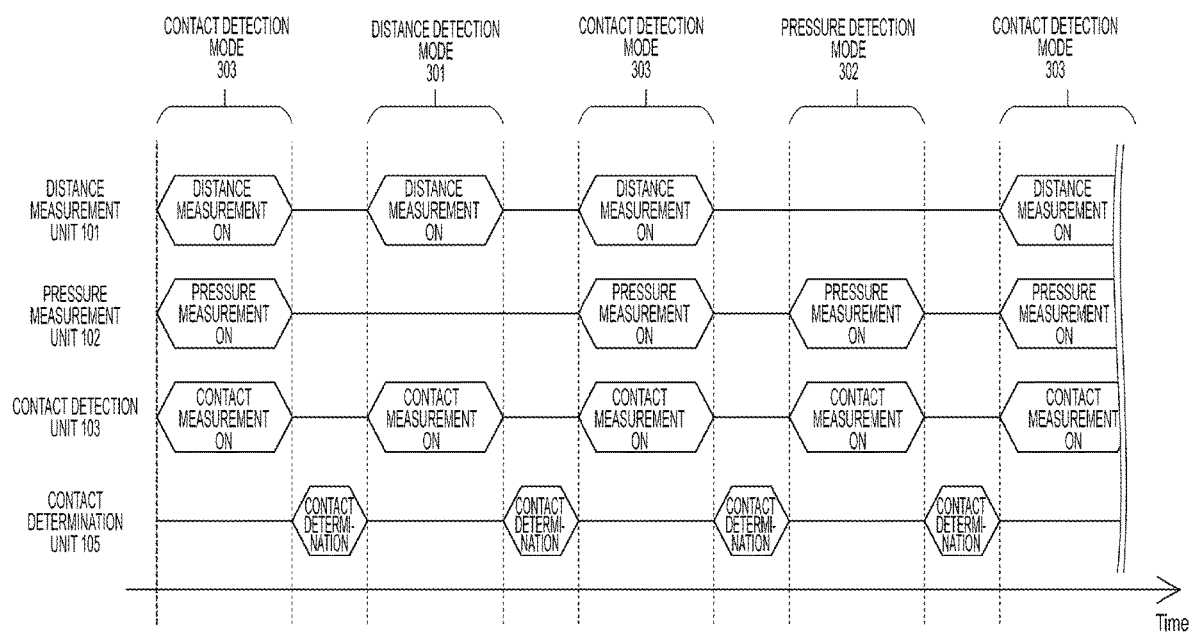
FIG. 4 is a schematic view for explaining another example structure of the first embodiment.

Other example structures will be further described with reference to FIGS. 3 and 4. The example structure illustrated in FIG. 3 is characterized by that a unit for switching a distance detection mode 301, a pressure detection mode 302, and a contact detection mode 303 is included. As illustrated in FIG. 4, in a distance detection mode 301, the distance measurement unit 101 and contact detection unit 103 are active and the pressure measurement unit 102 is inactive. On the other hand, in the pressure detection mode 302, the pressure measurement unit 102 and contact detection unit 103 are active, and the distance measurement unit 101 is inactive. More specifically, when the pressure measurement signal 202 indicates a minimum detectable pressure and the distance detection signal 201 is not a minimum detectable distance, the distance detection mode is selected. On the other hand, when the distance detection signal 201 is the minimum detectable distance and the pressure measurement signal 202 is not the minimum detectable pressure, the pressure detection mode is selected. Further, when the distance detection signal 201 is the minimum detectable distance and the pressure measurement signal 202 is the minimum detectable pressure, the distance measurement unit 101, pressure measurement unit 102, and contact detection unit 103 are active.

FIG. 4 schematically illustrates, as an example, operation by the distance measurement unit 101, pressure measurement signal 202, contact detection unit 103, and contact determination unit 105 when the modes are switched from the contact detection mode 303, the distance detection mode 301, the contact detection mode 303, the pressure detection mode 302, and then the contact detection mode 303 in order. FIG. 4 illustrates that the periods indicated by the hexagonal shapes represent that the objective units are operating, and the periods indicated by the lines represent that the objective units have stopped operating. Further, the configuration in FIG. 4 is illustrated assuming that the compound sensor has the configuration of FIG. 2B; however, the present embodiment is not limited to this example and other configurations may be used in the same manner.

In FIG. 3, since unnecessary operation in the units can be stopped, the entire consumption power can be reduced. Further, considering a case where a drive signal generated by the distance measurement unit 101 cases noise during the detection by the pressure measurement unit 102, deterioration of the pressure detection accuracy can be reduced. On the other hand, in a case where a reference signal used in the detection by the pressure measurement unit 102 causes noise during the detection by the distance measurement unit 101, deterioration of the pressure detection accuracy can be reduced.

Here, in the present embodiment, a case that each detection unit obtains a minimum detectable distance or a minimum detectable pressure has been explained as an example for illustrative purposes; however, the present embodiment is not limited to this example. A case where the signal becomes close to the minimum detectable distance or the minimum detectable pressure within the detection range of each detection unit can be used as a determination standard, and it may be optimally set, according to a usage condition, at which degree it becomes closer the determination is to be made. A compound sensor having a high responsiveness can be provided by making a determination when the signal becomes closer to the minimum detectable distance or the minimum detectable pressure.

Figure 5:
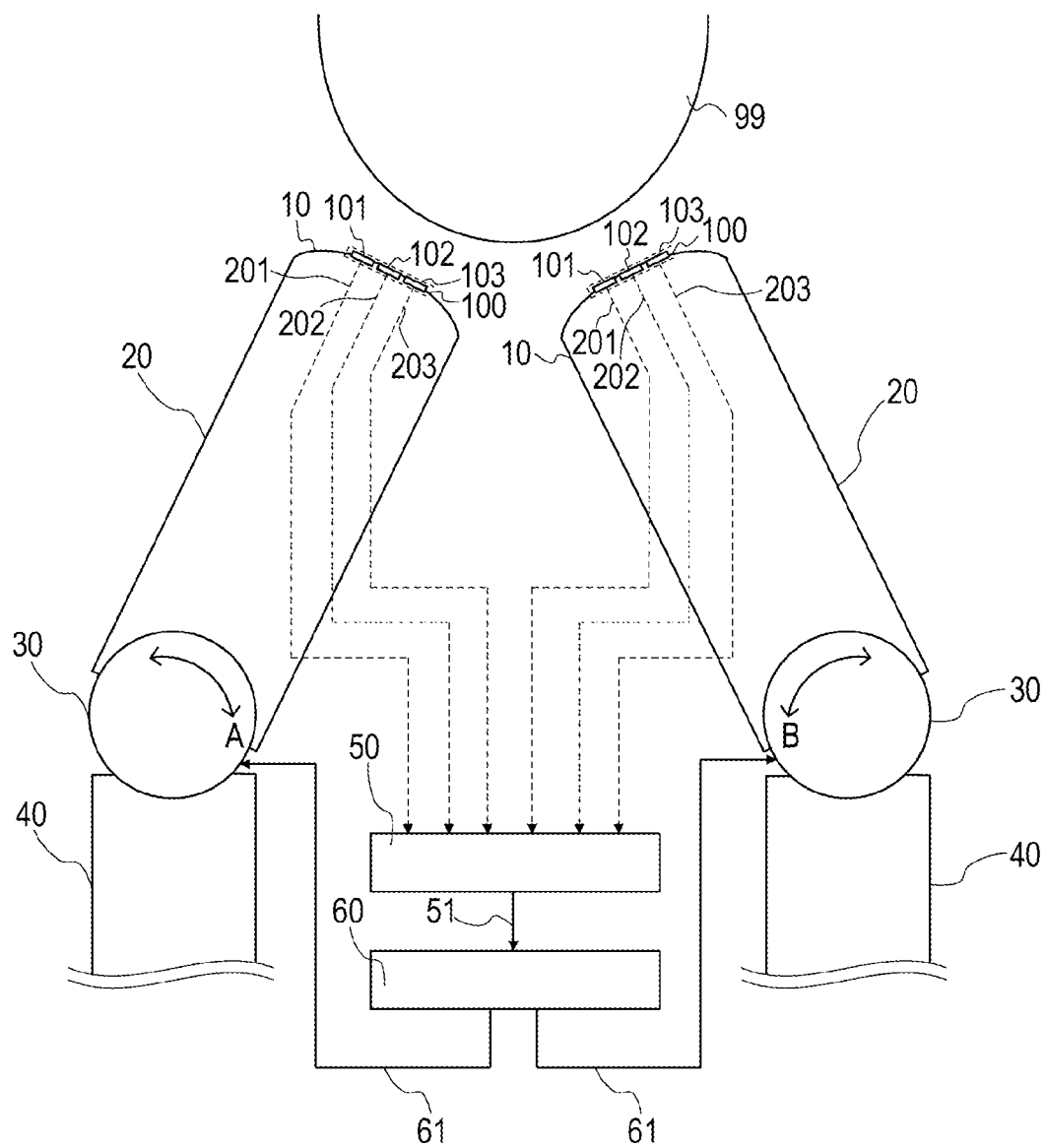
FIG. 5 is a schematic view for explaining another example structure of the first embodiment.

A robot hand system using the compound sensor according to the present embodiment will be described with reference to FIG. 5. In FIG. 5, the compound sensor 100 according to the present embodiment is provided at an end portion of a finger part 20. The finger part 20 is supported by a finger part drive unit 30 on a fixed part 40. The finger part drive unit 30 internally includes a driving mechanism such as a motor and a mechanism to operate in directions of the arrows A and B based on a drive signal 61 received from outside. The output signals 201, 202, and 203 from the compound sensor 100 are input to a finger position calculation unit 50, and the finger position calculation unit 50 calculates a position coordinate of a location (end portion 10) where the compound sensor 100 of each finger part 20 is provided based on the input signals and outputs the position coordinate as a finger part position information 51. The finger part control unit 60 generates a finger part drive signal 61 that instructs to drive the finger part 20, based on the finger part position information 51. For example, when the distance to the target 99 is large, a process to move the finger part 20 closer is performed and, when a force of the finger part 20 to hold the target 99 is weak, the force is made greater or the position of the finger part 20 is adjusted so that the target 99 can be held securely. In FIG. 5, since the compound sensor 100 that can accurately recognize whether there is a contact with the end portion 10 of the finger part 20, the distance, and the pressure is provided, the finger part 20 can be controlled toward the target 99 in a most appropriate manner.

Here, in FIG. 5, a configuration including two finger parts 20 and a single drive unit 30 provided to the finger part 20 is described; however, the present embodiment is not limited to this configuration. There may be more than two finger parts 20, or the drive unit 30 of the finger part 20 may have fingers including multiple joints.

Second Embodiment

A second embodiment relates to configurations of the distance measurement unit 101, pressure measurement unit 102, and contact detection unit 103. Other configurations are the same as those in the first embodiment. The second embodiment will be described with reference to FIGS. 6 to 10.

The second embodiment is characterized by that the distance measurement unit 101, pressure measurement unit 102, and contact detection unit 103 are composed by using a piezoelectric film, more specifically, a thin membrane having a thin film of a piezoelectric body.

Figure 6A:
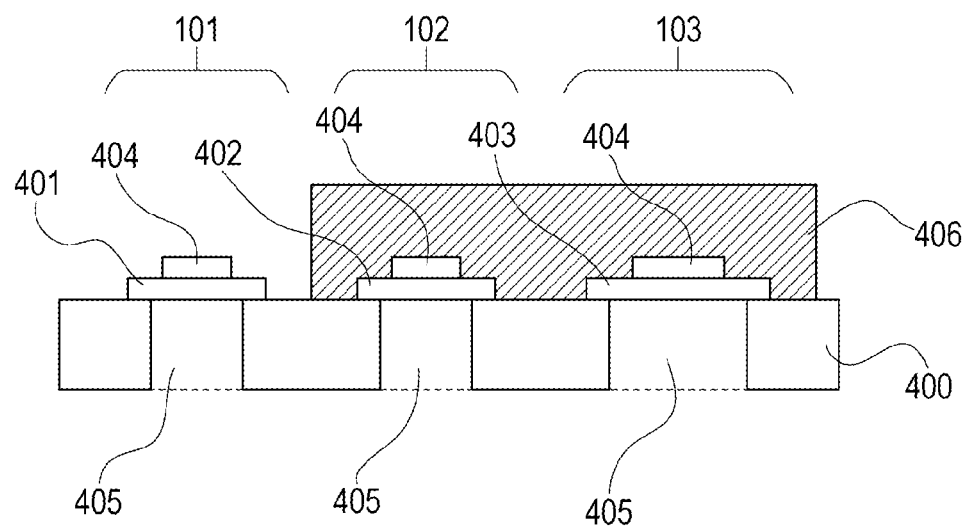
FIGS. 6A and 6B are schematic views for explaining a second embodiment.
Figure 6B:
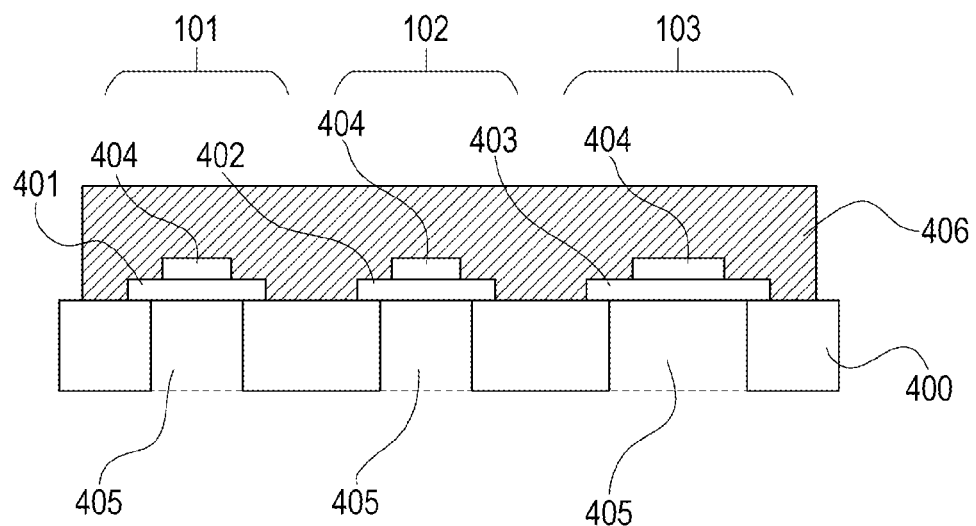

FIGS. 6A and 6B are schematic perspective views for explaining the compound sensor according to the present embodiment. In FIGS. 6A and 6B, 400 represents a substrate, 401, 402, and 403 represent membranes, 404 represent thin film piezoelectric bodies, 405 represents through holes, and 406 represents an elastic body.

The membranes 401, 402, and 403 are provided on a surface of the substrate 400 having the plurality of through holes 405. To the membranes 401, 402, and 403 on the through hole 405, the thin piezoelectric bodies 404 are provided respectively. The respective membranes 401, 402, and 403 composing the distance measurement unit 101, pressure measurement unit 102, and contact detection unit 103 basically have the same configuration while the size of the through hole 405, the thickness of the piezoelectric body 404, and the thickness of the membrane, and the like are adjusted in a most preferable manner. The membranes 401, 402, and 403 may be made of anything such as a silicon nitride film, silicon, metal, and the like as long as that necessary mechanical characteristics can be obtained. Further, the substrate 400 may be made of anything such as silicon, glass, metal, glass epoxy, or the like, as long as mechanical characteristics and an adhesiveness to the membrane, and an insulation property can be obtained.

In the membrane 401 of the distance measurement unit 101, an ultrasonic wave is transmitted by applying a drive voltage to the piezoelectric thin film 404 and vibrate the membrane 401. On the other hand, as a reflected ultrasonic wave achieves and vibrates the membrane 401, and the reception is performed by detecting a voltage generated in the piezoelectric thin film 404.

On the membrane 402 of the pressure measurement unit 102 and the membrane 403 of the contact detection unit 103, the elastic body 406 is provided. With the elastic body 406, pressure applied to the target 99 can be evenly transferred to the membranes 402 and 403. Further, with the elastic body 406, the membranes 402 and 403 may also be protected from the target 99.

The membrane 403 of the contact detection unit 103 is made softer and can be widely deformed by a smaller pressure, compared to the membrane 402 of the pressure measurement unit 102. More specifically, the membrane 403 may be easily realized with a configuration such that the vibrating membrane of the membrane is made thinner or the size of the membrane is made larger.

In the configuration using the membranes according to the present embodiment, the membranes may be formed on the same substrate 400 in a same manufacturing process and easily integrated in a single chip. In addition, the low-cost compound sensor can be easily realized. Further, since circuits needed in each unit can easily be integrated on a substrate, a smaller compound sensor can be provided.

The compound sensor according to the present embodiment can provide a compound sensor including a proximity sense and a tactile sense which can be easily integrated and accurately recognize a contact with the target.

Here, in FIG. 6A, nothing is provided on the membrane 401 of the distance measurement unit 101, and the membrane 401 of the distance measurement unit 101 are made to directly contact with the air; however, the present embodiment is not limited to this example. As illustrated in FIG. 6B, there may be a configuration in which the elastic body 406 is provided on the membrane 401 on the distance measurement unit 101. Since the elastic body 406 is provided to cover all over the substrate 400, this can make its fabrication easier. Further, since a function that the surface of the membrane 401 is protected by the elastic body 406 is added, this can prevent the membrane 401 from being broken when contacting with the target 99. Here, the elastic body 406 used in this example is preferably made of a material that passes an ultrasonic wave therethrough and hardly gives an affect to the mechanical characteristics of the membrane 401 (a material having modulus of smaller longitudinal elasticity compared to the material of the membrane is further suitable). The material may be selected from silicone rubber, ethylene-propylene rubber (EPDM), dimethyl polysiloxane (PDMS), urethane rubber, and the like.

Figure 7:
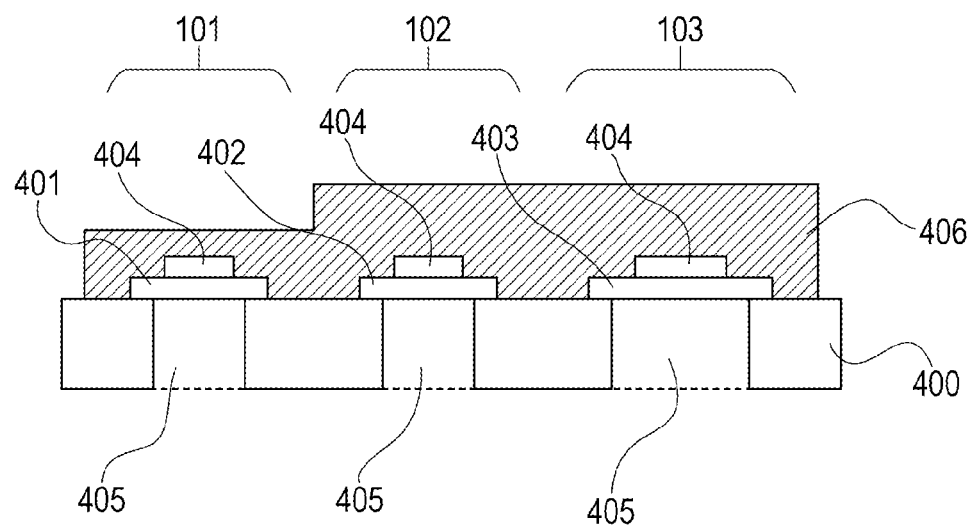
FIG. 7 is a schematic view for explaining the second embodiment.

Further, as illustrated in FIG. 7, the thickness of the elastic body 406 on the membrane 401 of the distance measurement unit 101 is preferably made thinner than the thickness of the elastic body 406 on the membrane 402 and the membrane 403. With this configuration, attenuation of the ultrasonic wave in the elastic body 406 can be minimized when the ultrasonic wave is transmitted and received, a large transmission/reception signal can be obtained and a more accurate distance measurement can be performed.

Figure 8:
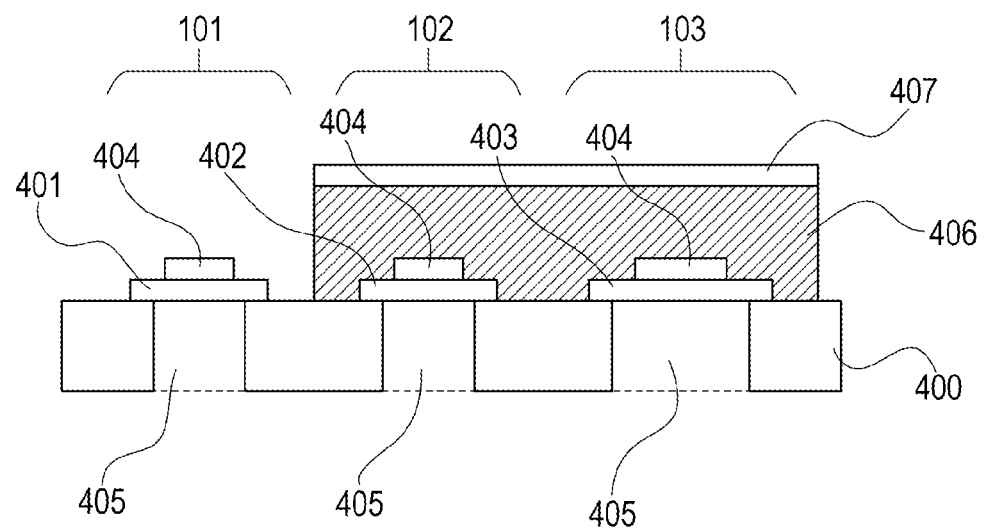
FIG. 8 is a schematic view for explaining the second embodiment.

Further, as illustrated in FIG. 8, it is preferable that the load distribution plate 407 is provided further above the elastic body 406 on the membrane 402 and membrane 403. Since the load distribution plate 407 is provided and an average pressure is applied to the sensor and a stable measurement can be performed even in a case where the target 99 has an uneven surface shape or pressure from the target 99 varies depending on the locations. Further, in FIGS. 6 to 8, only one membrane 402 and one membrane 403 are provided; however, in actual, a plurality of membranes 402 and a plurality of membranes 403 are provided as groups. Here, since the membranes are arranged with a certain intervals therebetween because of a constraint of arrangement, there may be an area in which there is no membrane on the substrate 400. However, when the load distribution plate 407 is provided, the pressure from the target 99 are collected as an amount of the surface area of the load distribution plate 407 and even pressure is applied to the membranes 402 and 403 regardless of the presence of the membrane, and this allows an accurate measurement.

Figure 9:
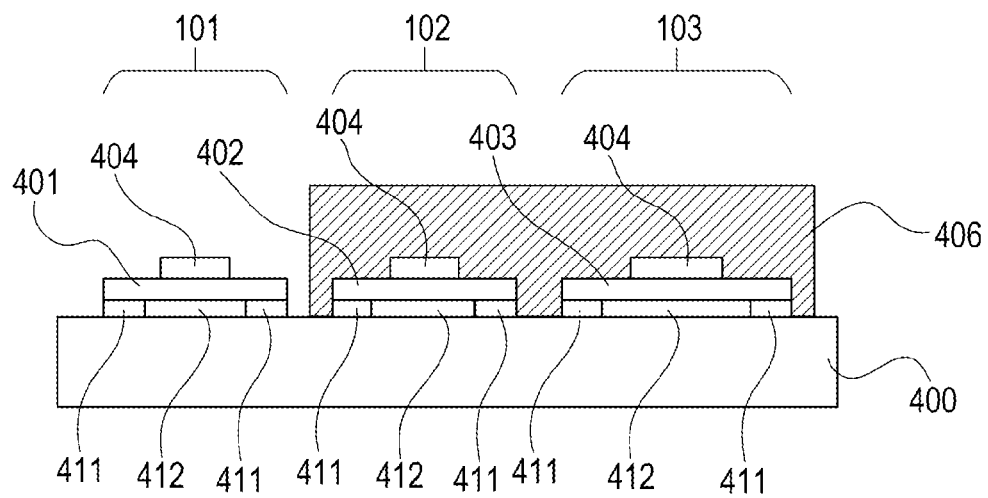
FIG. 9 is a schematic view for explaining the second embodiment.

Another example structure of the present embodiment will be described with reference to FIG. 9. The configuration illustrated in FIG. 9 is characterized by that the substrate 400 does not have the through hole 405, the membrane 401 is provided on the supporting part 411 which is placed on the substrate 400 and is held above the surface of the substrate 400 with a space 412. With this configuration, even when the membrane 401 vibrates during transmission or reception of the ultrasonic wave or the membrane 401 is deformed due to a pressure from the target 99, the membrane 401 does not interfere with the substrate 400 and the measurement and detection operation can be performed.

In the configuration illustrated in FIG. 6, to provide a plurality of through holes 405, the rigidity of the substrate 400 needs to be maintained and the distance between the through holes 405 needs to be made greater than a certain distance. Further, when the through holes 405 are formed in a thick substrate 400, which has a thickness of hundreds of micrometers, since an angle (taper) is made in a side wall, larger intervals may be required. Thus, the intervals between the membrane 401 is determined according to the intervals between the through holes 405, this may be a constraint when increasing the degree of integration.

On the other hand, in the case of the compound sensor 100 in the configuration illustrated in FIG. 9, which is another example structure of the present embodiment, since the through holes 405 are not needed to be provided in the substrate 400, the above describe constraint is not applied.

Thus, the membranes 401, 402, and 403 may be provided close to one another and this helps in a view of downsizing. In other words, since the rate of the membranes can be made larger within a same sensor area, measurement accuracy and detection accuracy of the sensor can be improved, and high accurate measurement and detection can be performed.

Figure 10:
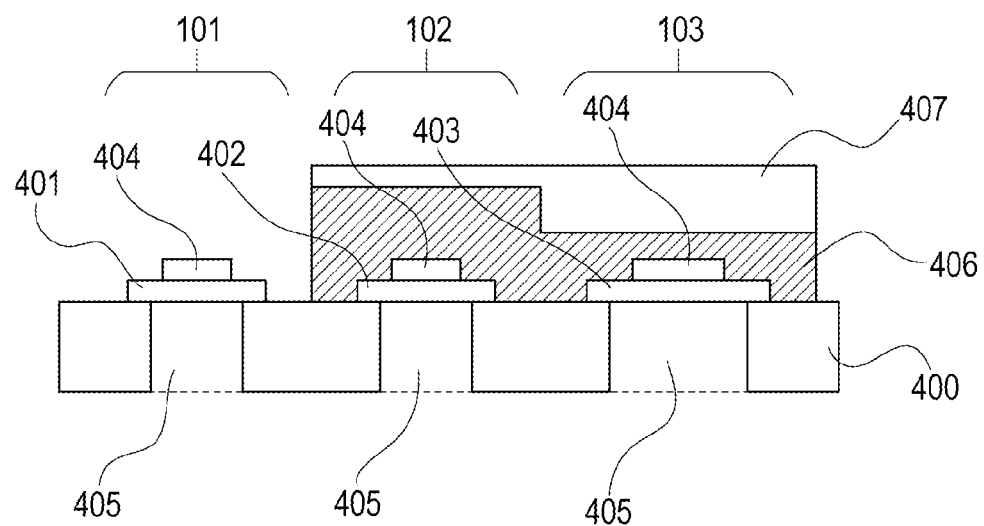
FIG. 10 is a schematic view for explaining the second embodiment.

Further, as illustrated in FIG. 10, the thickness of the load distribution plate 407 on the membrane 403 of the contact detection unit 103 can be made thicker, compared to the thickness of the load distribution plate 407 on the membrane 402 of the pressure measurement unit 102. Thus, even when the load distribution plate 407 is displaced with a same distance vertically with respect to the substrate 400, since the thickness of the compressed elastic body 406 is smaller, a greater pressure is applied in the side of the membrane 403 of the contact detection unit 103 and the contact detection can be more accurately performed.

Third Embodiment

A third embodiment relates to configurations of the distance measurement unit 101, pressure measurement unit 102, and contact detection unit 103. Other configurations are the same as those in FIG. 9. The third embodiment will be described with reference to FIG. 11.

The third embodiment is characterized by that the distance measurement unit 101, pressure measurement unit 102, and contact detection unit 103 are formed by using static capacitance between electrodes 421 provided on the thin membranes 401, 402, and 403 and opposite electrodes 422 provided on the substrate 400.

Figure 11:
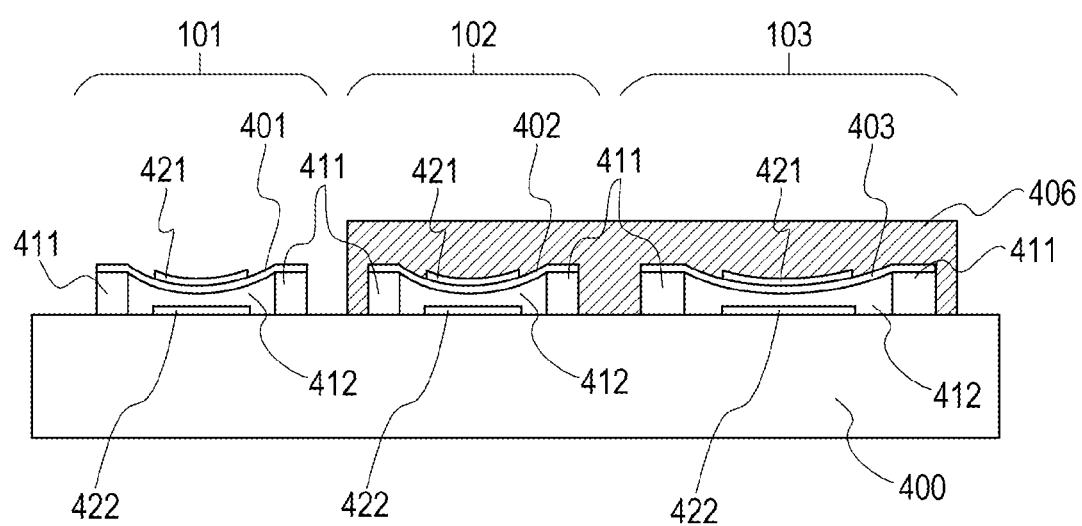
FIG. 11 is a schematic view for explaining a third embodiment.

FIG. 11 is a schematic view for explaining the compound sensor according to the present embodiment. In FIG. 11, 421 represents first electrodes, and 422 represents second electrodes.

The membranes 401, 402, and 403 according to the present embodiment are supported by supporting parts 411 provided on the substrate 400. The first electrodes 421 are provided on the membranes 401, 402, and 403 so as to be deformed integrally with the membranes 401, 402, and 403. On the substrate 400 facing to the first electrodes 421, the second electrodes 422 are provided. The sensor is used in a condition that, a certain potential difference Vb is always applied between the first electrode 421 and second electrode 422, the membranes 401, 402, and 403 are deformed toward the substrate 400, and tension is always applied toward the substrate 400.

In the distance measurement unit 101, by applying an alternating potential difference between the first electrode 421 and second electrode 422, the membrane 401 is vibrated and an ultrasonic wave is transmitted. On the other hand, when the ultrasonic wave reaches the membrane 401, the membrane 401 vibrates, and the static capacitance between the first electrode 421 and second electrode 422 changes. Since a certain potential difference Vb is always being applied between the first electrode 421 and second electrode 422, a magnitude of the received ultrasonic wave can be measured by detecting a minute electric current caused by the change in the capacitance.

In the pressure measurement unit 102, the amount of the deformation of the membrane 402 changes when a pressure is applied by the target 99, and this results in that a static capacitance value between the first electrode 421 and second electrode 422 changes. By measuring the static capacitance value, the applied pressure can be recognized. A method for measuring the static capacitance value can be easily realized by using a C-V conversion circuit, or the like. Further, a change in the capacitance may be further accurately detected when a frequency that does not vibrate the membrane 402 is selected, a frequency of a reference signal is applied, an induced current caused thereby is measured, and the detection is performed with the frequency of the reference signal.

The contact detection unit 103 is designed so that the membrane 403 deforms in a considerably larger manner, compared to the membrane 402, which deforms in the pressure measurement unit 102, when a same pressure is applied. More specifically, it can be preferably adjusted by making the thickness of the membrane 403 thinner or making the diameter of the membrane 403 larger. With this, since the configuration can be realized simply by changing an in-plane pattern of the membrane or changing the thickness of the thin film to be layered as the membrane.

In addition to the method of changing the deformation amount of the membrane 403 with respect to the input pressure, a method of making the change in the static capacitance larger by reducing the height of the supporting part 411 and making the space between the first electrode 421 and second electrode 422 smaller, even with the same deformation amount of the membrane 403. With this, since the detection signal itself can be enlarged, an SN ratio can be improved, and the detection accuracy can be further improved.

Further, the same effect can be obtained by increasing a direct potential difference applied between the first electrode 421 and second electrode 422 and making an initial deformation of the membrane 403 larger, compared to the case that the height of the supporting part 411 is lowered. In addition, since an electric field density between the first electrode and second electrode is increased, when the static capacitance is detected, a larger signal can be obtained, and the detection accuracy may be improved.

Here, in a sensor of a static capacitance type, when the electrostatic attractive force generated by the potential difference between the first electrode and second electrode excesses the magnitude of a restoration force made by a spring in the membrane 403, the membrane 403 is pulled toward the substrate 400 (this is called "pull in"). Thus, in the sensor of the static capacitance type, as the sensitivity with respect to the applied pressure is made greater, the upper limit of the pressure that the pull-in is generated becomes reduced and the maximum detectable magnitude is reduced. Thus, the pressure measurement unit 102, which detects up to a large pressure, and the contact detection unit 103, which detects an imperceptible pressure when contacting with the target, are provided as different units, the measurement and detection thereof can have the most appropriate characteristics respectively, like the present embodiment.

According to the present embodiment, since the sensor of the static capacitance type is used, the distance measurement unit 101, pressure measurement unit 102, and contact detection unit 103 can be easily integrated on the substrate 400 and the entire compound sensor can be downsized. Further, since only the electrodes 421 and 422 need to be provided and the configuration becomes simple, the sensor can be realized by a more general semiconductor process and the manufacturing cost can be easily reduced, compared to the configuration according to the second embodiment.

As described above, according to the present embodiment, a compound sensor having a proximity sense and a tactile sense that can be easily downsized, have a simple configuration, and accurately recognize a contact with a target can be provided.

Here, the present embodiment has described that all the distance measurement unit 101, pressure measurement unit 102, and contact detection unit 103 are all sensors of a static capacitance; however, the present embodiment is not limited to this example. There may be a configuration that the sensor in which a thin-film piezoelectric body 404 is formed on a membrane as described in the second embodiment may be provided in a mixed manner.

Fourth Embodiment

A fourth embodiment relates to a configuration of the contact detection unit 103. Other configurations are the same as those of the third embodiment. The fourth embodiment will be described with reference to FIGS. 12A and 12B.

The fourth embodiment is characterized by that a presence or an absence of a contact between the membrane 403 and substrate 400 is used for a contact detection by the contact detection unit 103.

Figure 12A:
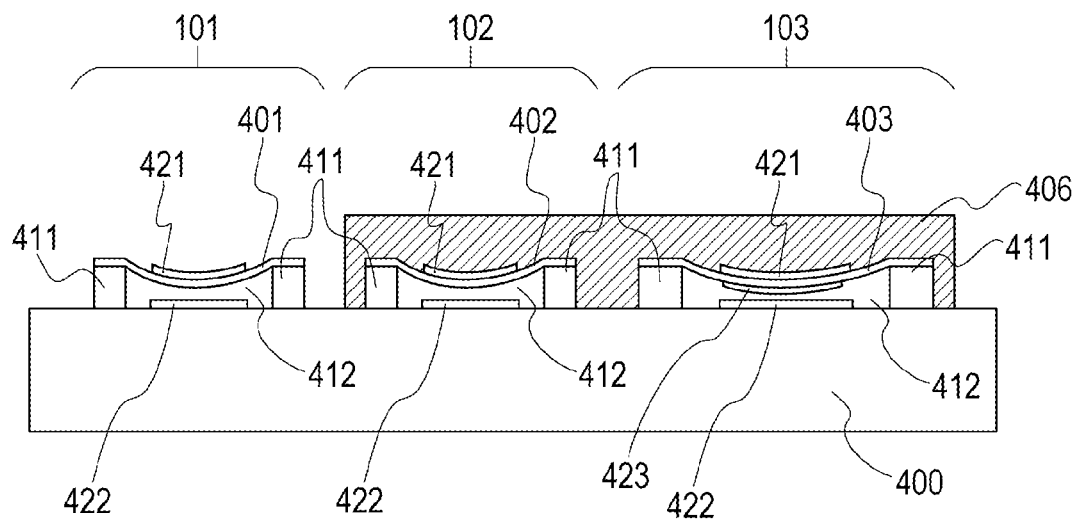
FIGS. 12A and 12B are schematic views for explaining a fourth embodiment.
Figure 12B:
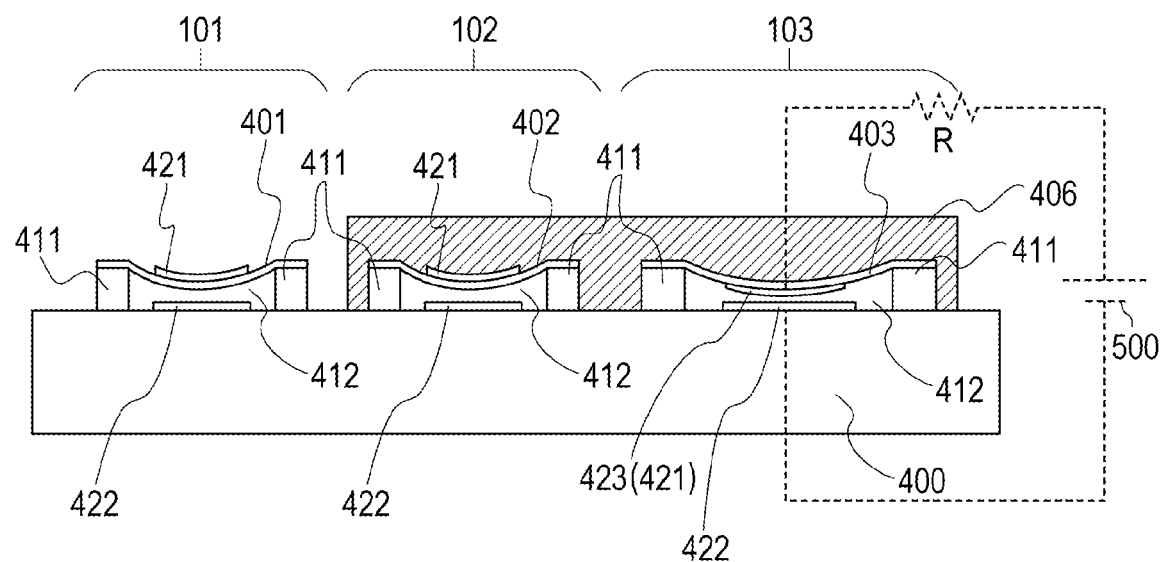

In FIGS. 12A and 12B, 423 represents a contact detection electrode.

According to the present embodiment, a contact detection electrode 313 is provided under the membrane 403. When the target 99 contacts with the surface of the sensor, the pressure is applied to the membrane 403 in the contact detection unit 103. Between the first electrode 421 on the membrane 403 and the second electrode 422, a potential difference Vb is applied and an electrostatic attractive force is always being applied. Here, the restoration force of a spring is simply proportional to the distance when the distance between the electrodes becomes smaller; however, it should be focused on that the electrostatic attractive force is inversely proportional to the square of the distance when the distance between the electrodes becomes smaller, and the electrostatic attractive force rapidly increases.

According to the present embodiment, it is adjusted so that, when an external force is applied to the membrane 403 and the membrane 403 deforms, the electrostatic attractive force easily exceeds the restoration force of the spring in the membrane 403, and the membrane 403 contacts with the lower electrode at once. With this configuration, when the target 99 contacts with the surface of the sensor 100, the contact detection electrode 423 immediately under the membrane 403 and the second electrode 422 on the substrate 400 are electrically contacted, the contact with the target 99 can be easily detected by measuring a resistance value between the contact detection electrode 423 and second electrode 422.

Further, as illustrated in FIG. 12B, there may be a configuration that the second electrode 422 and contact detection electrode 423 are integrally formed. This simplifies the configuration since it is realized by simply forming an electrode on a lower surface (the surface facing to the substrate 400) of the membrane 403. This configuration is characterized by that a resistance R is inserted between the first electrode 421 and second electrode 422, and in a path of a unit 500 that applies a potential difference Vb between the electrodes. With this configuration, even when the first electrode 421 having a certain potential difference contacts with the second electrode 422 (contact detection electrode 423), an excessive current can be prevented and a breakage or a malfunction of the electrodes, conductive lines, and a potential difference generating unit can be prevented.

Further, there may be a configuration that a piezoresistive element is provided on the membrane, as a substitute for the electrodes 421 and 422. A contact can be detected by detecting a change in piezoresistive values caused by an imperceptible deflection when the target 99 contacts with the sensor surface and the membrane 403 deforms. Further, when more than one piezoresistive elements are provided and Wheatstone bridge is formed, the presence of a contact can be more accurately detected whether.

Fifth Embodiment

A fifth embodiment relates to an arrangement of the distance measurement unit 101, pressure measurement unit 102, and contact detection unit 103. Other arrangements are the same as those in any one of the first to fourth embodiments. The fifth embodiment will be described with reference to FIGS. 13 to 16.

Figure 13:
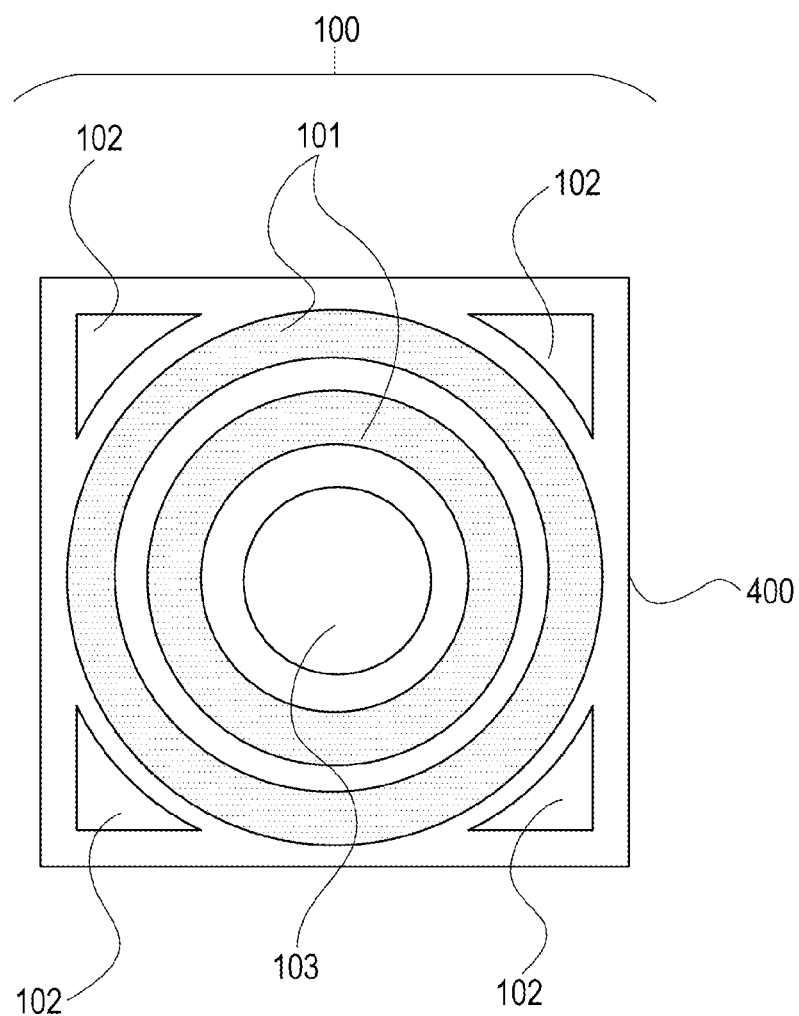
FIG. 13 is a schematic view for explaining a fifth embodiment.

The configuration illustrated in FIG. 13 is characterized by that the contact detection unit 103 is provided in a center of the compound sensor 100. With this configuration, the compound sensor 100 provided at the end portion of the robot hand approaches, as facing straight, to the target 99 having a curved surface, the contact detection unit 103 firstly contacts with the target 99. Thus, the contact with the target 99 can be more quickly detected.

Further, in FIG. 13, the distance measurement unit 101 is formed of annular shapes and provided so as to surround the contact detection unit 103. When transmitting an ultrasonic wave, the distance measurement unit 101 drives the separate annular element respectively with a time lag so that the location on which the ultrasonic wave is made to focus can be adjusted. In a same manner, when an ultrasonic wave is received, signals detected by respective separate annular elements are added with a time lag, and this improves the resolution within the surface at a certain distance. With such a configuration, the beam of the ultrasonic wave to be transmitted or received within a certain distance can be narrowed, the distance can be measured more accurately.

In FIG. 13, the pressure measurement unit 102 is provided at remained spaces in four corners on the substrate 400. Thus, with the configuration illustrated in FIG. 6A, the sensors of the three types can be efficiently arranged in a small area and a downsized compound sensor can be provided.

Figure 14:
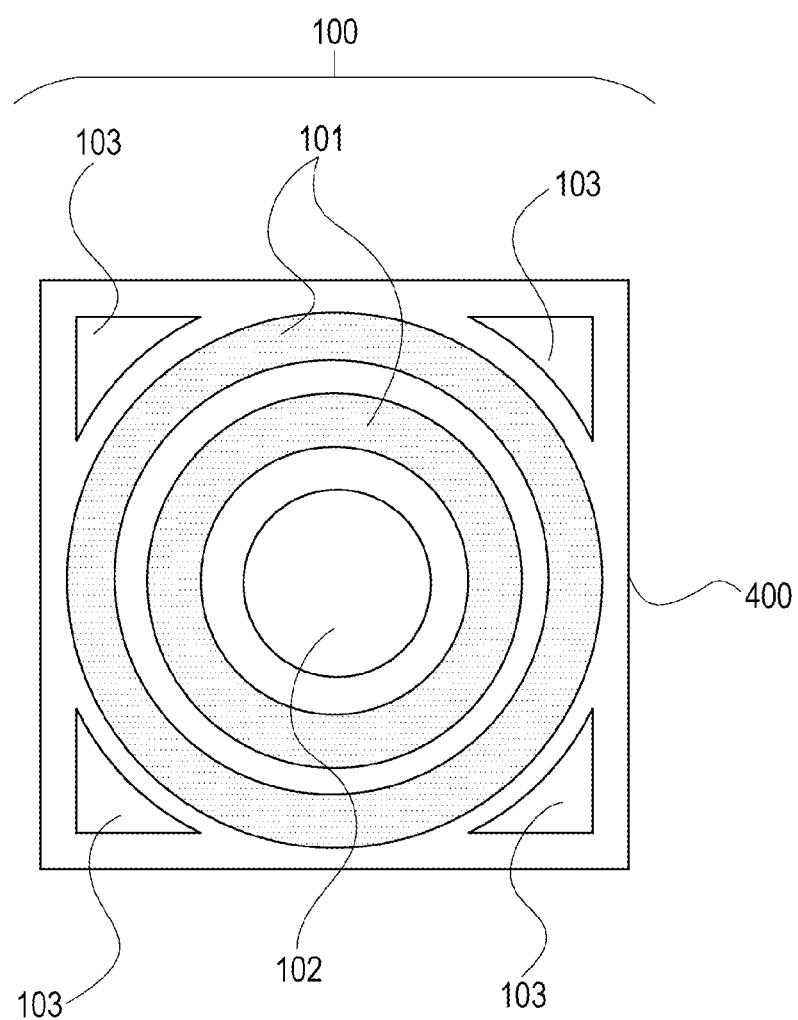
FIG. 14 is a schematic view for explaining the fifth embodiment.

Another example structure of the present embodiment will be described with reference to FIG. 14. The configuration illustrated in FIG. 14 is characterized by that the contact detection unit 103 is provided in outer areas in the compound sensor 100. When the compound sensor 100 provided at the end portion of the robot hand approaches to the target 99 in a tilted manner, the contact detection unit 103 firstly contacts with the target 99. Thus, the contact with the target 99 can be more quickly detected.

With reference to FIGS. 13 and 14, the configuration that the contact detection unit 103 is provided at the center and the configuration that the contact detection unit 103 is provided in four corners have been respectively described; however, the present embodiment is not limited to these examples and the above configuration may be combined. This makes a preferable configuration since a contact with the target 99 can be detected more quickly even when the target 99 is facing straight or tilted.

Figure 15:
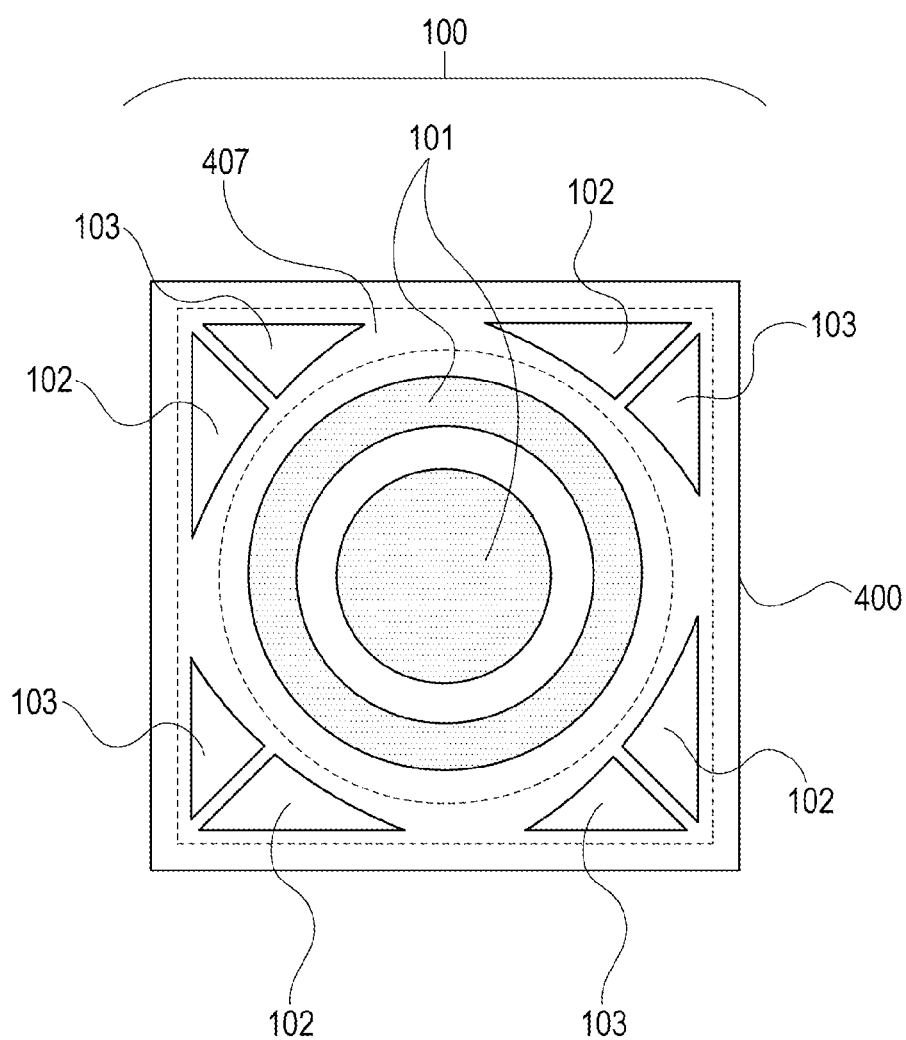
FIG. 15 is a schematic view for explaining the fifth embodiment.

FIG. 15 illustrates a configuration that the pressure measurement unit 102 and contact detection unit 103 are provided in periphery areas of the substrate 400. This makes the configuration simple in which the load distribution plate 407 having a round shape cut out therefrom (which is illustrated with dotted lines in FIG. 15) is provided in the outer areas on the substrate 400, in a case of the configuration including the elastic body 406 and load distribution plate 407. Further, since the load distribution plate 407 is provided, the pressure from the target 99 can be efficiently transferred to the pressure measurement unit 102 and contact detection unit 103 and accurate measurement can be performed. In addition, the load distribution plate 407 is not placed above the distance measurement unit 101 provided in the center of the substrate 400, distance measurement can be performed without having interference in the transmission and reception of an ultrasonic wave. With the configuration illustrated in FIG. 15, a compound sensor that can perform an accurate detection with a simple configuration can be provided.

Figure 16:
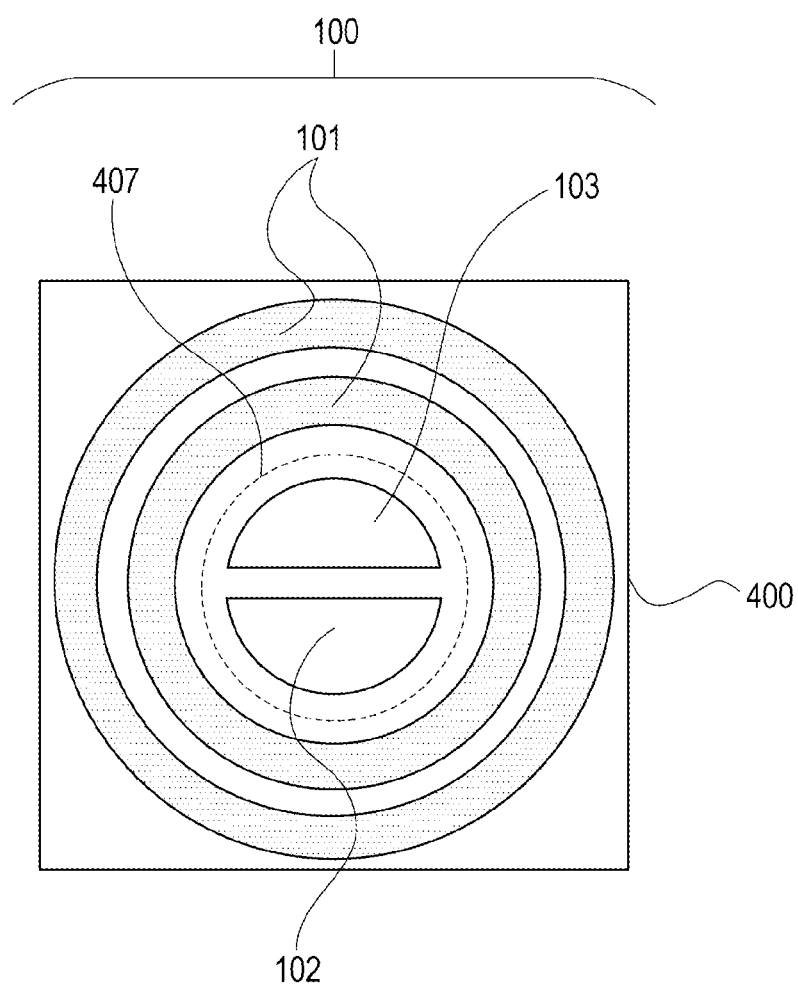
FIG. 16 is a schematic view for explaining the fifth embodiment.

On the other hand, as illustrated in FIG. 16, there may be a configuration that the pressure measurement unit 102 and contact detection unit 103 are provided in the center of the substrate 400. This makes the configuration simple in which the load distribution plate 407 in a round shape (which is illustrated with a dotted line in FIG. 16) is provided in the center of the substrate 400, in a case of the configuration including the load distribution plate 407. Further, since the load distribution plate 407 is provided, the pressure from the target 99 can be efficiently transferred to the pressure measurement unit 102 and contact detection unit 103 and high-accurate measurement can be performed. In addition, since the load distribution plate 407 is not placed above the distance measurement unit 101 provided in the outer areas on the substrate 400, distance measurement can be performed without having interference in the transmission and reception of an ultrasonic wave. With the configuration illustrated in FIG. 16, the sensors of the three types can be efficiently arranged on the substrate 400 and a compound sensor that can perform accurate detection with a simple configuration can be provided.

With reference to FIGS. 15 and 16, the configurations that the load distribution plate 407 is provided on the substrate 400 via the elastic body 406 have been described. Here, the area where the elastic body 406 is placed may be only under the load distribution plate 407 or may be the entire area on the substrate 400, and any of the example structures may be used.

Sixth Embodiment

A sixth embodiment relates to a type of the measurement unit 101. Other configurations are the same as those in any one of the first to fifth embodiments. The sixth embodiment will be described with reference to FIGS. 17A, 17B, and 18.

The sixth embodiment will be described by using the configuration of the static capacitance type sensor including a membrane and opposite electrodes, which has been described in the third embodiment. In FIGS. 17A, 17B, and 18, 108 represents a shear force detection unit, 108a represents an ultrasonic wave transmitting/receiving element, 108b represents an ultrasonic wave receiving element, X indicates directions of sliding, 408 represents a membrane, and 409 represents a protrusion of the load distribution plate 407. In these drawings, the pressure measurement unit 102 and contact detection unit 103 on the same substrate 400 are omitted and only the distance measurement unit 101 and shear force detection unit 108 are illustrated.

The sixth embodiment includes a unit 108 (slide sense sensor) for detecting a shear force in a horizontal direction with respect to the substrate surface, in addition to the proximity sense, tactile sense, and tactile sense. Here, the description will be given with reference to the configuration according to the third embodiment. The shear force detection unit 108 is composed of the element 108a that transmits and receives an ultrasonic wave and an element 108b that receives an ultrasonic wave. On the membrane 408 in the shear force detection unit 108, the load distribution plate 407 is provided via the elastic body 406. To the load distribution plate 407 above the element 108a that transmits and receives an ultrasonic wave, the protrusion 409 is provided.

An ultrasonic wave 211 is transmitted from the ultrasonic wave transmitting/receiving element 108a toward a lower face of the load distribution plate 407. The ultrasonic wave is reflected by the protrusion 409 of the load distribution plate 407. The reflected ultrasonic wave 212 is received by the ultrasonic wave transmitting/receiving element 108a and the ultrasonic wave receiving element 108b provided near the ultrasonic wave transmitting/receiving element 108a. When a shear force (a slide force) in a horizontal direction with respect to the substrate surface is generated between the surface of the target 99 and the surface of the compound sensor 100, since the elastic body 406 is flexible and slightly deforms, and the load distribution plate 407 moves in the horizontal direction with respect to the substrate (for example, the directions of arrow X in FIG. 17A). When the load distribution plate 407 moves in a parallel manner, the position of the protrusion 409 changes and the magnitude or a delay time of the ultrasonic wave received by the transmitting/receiving element 108a and receiving element 108b changes. Based on those received signals, the amount of the parallel displacement of the load distribution plate 407 is detected and, thus, the shear force applied from the target 99 to the surfaces of the compound sensor 100 can be detected.

The sixth embodiment is characterized by that it is switched whether to activate the distance detection unit 101 or shear force detection unit 108, based on the contact detection signal 203 from the contact detection unit 103. More specifically, when a contact state is not detected, the distance detection unit 101 is made active and the shear force detection unit 108 is stopped. On the other hand, when a contact state is detected, the distance detection unit 101 is stopped and the shear force detection unit 108 is made active. Since the distance detection unit 101 and shear force detection unit 108 both make a measurement by transmitting and receiving ultrasonic waves, a leakage of a drive signal or a transmitted ultrasonic wave from detection operation in one side may affect the detection in the other side. In the configuration according to the present embodiment, since the contact detection unit 103 is provided, a unit to be activated and a unit to be stopped can be selected as described above. This prevents that an ultrasonic wave used in the measurement in one side affects in the measurement in the other side, and the high-accurate measurement can be performed.

Figure 17A:
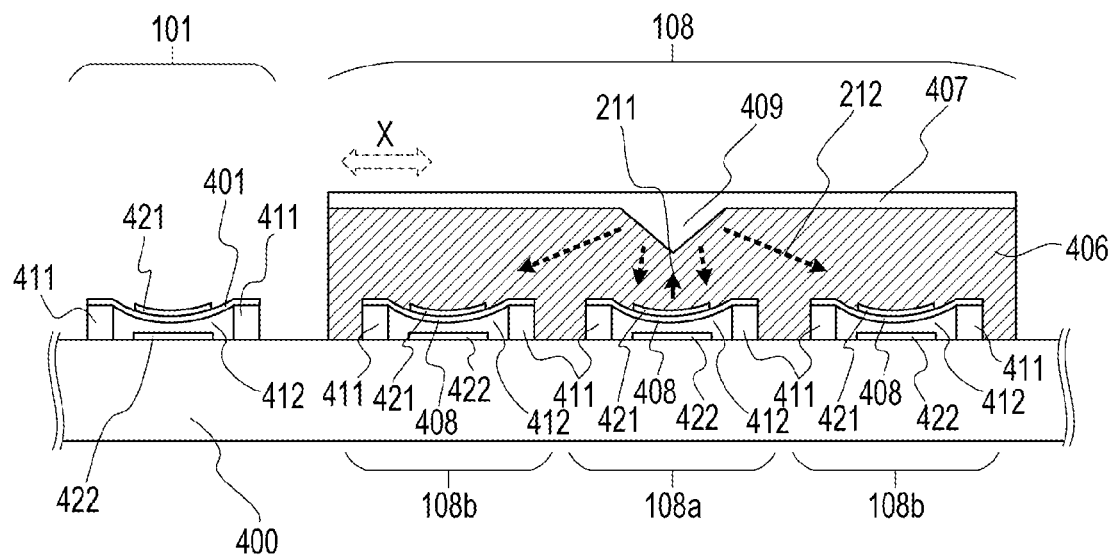
FIGS. 17A and 17B are schematic views for explaining a sixth embodiment.

Here, with reference to FIG. 17A, a configuration that the load distribution plate 407 has the protrusion 409 has been described; however, the present embodiment is not limited to this example, and a similar effect may be obtained with a configuration that an air gap 415, which is not filled with the elastic body 406, is provided at the area of the protrusion 409, for example. This configuration uses characteristics that the ultrasonic wave is reflected by a border having a large difference of acoustic impedance and can be realized with a simple configuration since only the area to be filled with the elastic body 406 is adjusted.

Figure 17B:
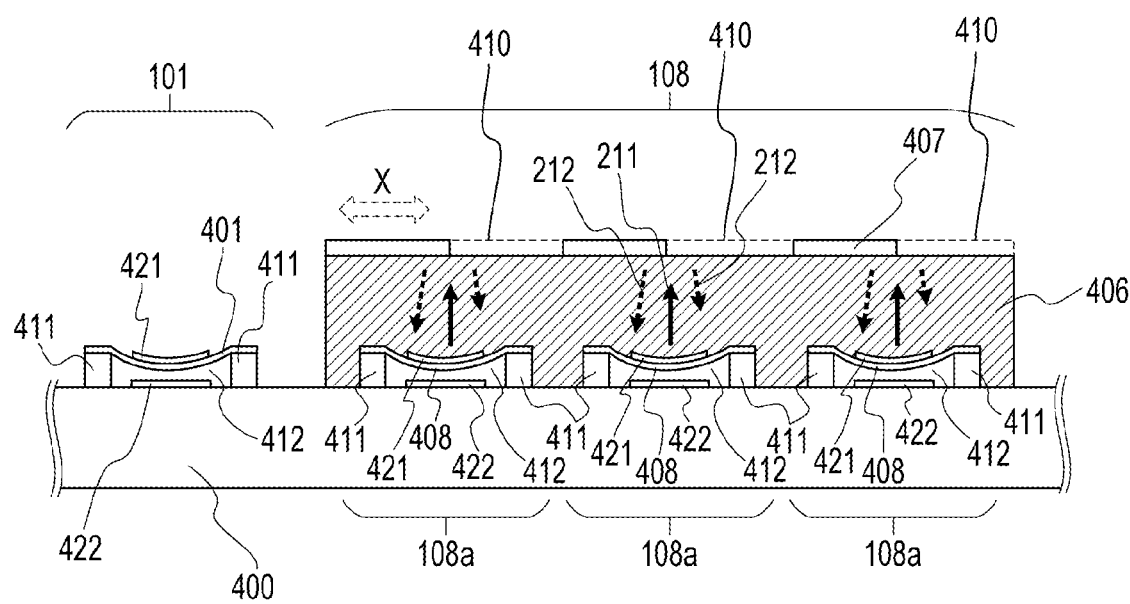

Another example structure of the present embodiment will be described with reference to FIG. 17B. In FIG. 17B, the load distribution plate 407 has holes 410. The shear force detection unit 108 is composed of the transmitting/receiving element 108a, and the hole 410 is provided so that a half of the transmitting/receiving element 108a is covered by the load distribution plate 407. When a shear force is applied from the target 99 to the surface of the sensor 100 and the load distribution plate 407 is displaced in the direction of the arrow X for example, the positions of the holes 410 are shifted and the size of the openings changes. This causes a change in the magnitude of the ultrasonic wave 212 reflected by the load distribution plate 407 after the ultrasonic wave 211 is transmitted. Based on the information, the shear force can be measured. The configuration illustrated in FIG. 17B can be realized in a further simple manner, since the shear force can be detected only by providing the holes in the load distribution plate 407.

As described above, according to the present embodiment, a compound sensor having a proximity sense and a tactile sense that can be easily downsized, have a simple configuration, and more accurately recognize a contact with a target can be provided.

Figure 18:
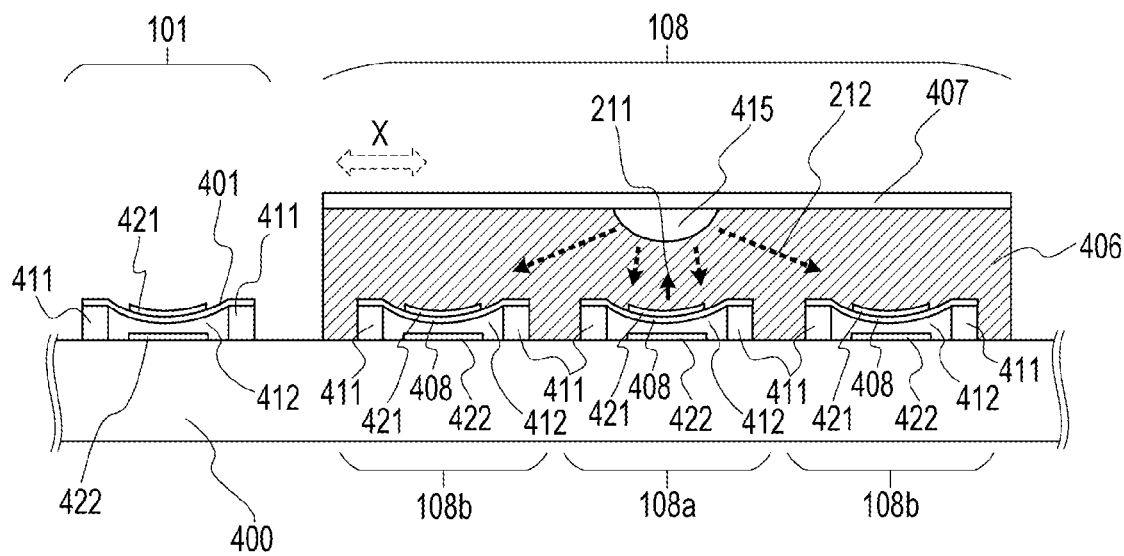
FIG. 18 is a schematic view for explaining the sixth embodiment.

Here, with reference to FIGS. 17A, 17B and 18, the shear force in one direction has been described for illustrative purposes; however, the present embodiment is not limited to this configuration and may be applied to measurement of shear force in two of in-plane directions in the similar manner. In such a case, the detection of the two of the in-plane directions can be easily realized by adjusting the shape of the protrusion 409 in FIG. 17A or the shape of the holes 410 in FIG. 17B, and the configuration hardly needs to be changed.

Further, with reference to FIGS. 17A and 17B, the configuration that the pressure measurement unit 102, contact detection unit 103, and shear force detection unit 108 are provided as separate components; however, the present embodiment is not limited to this example. In the configuration, as illustrated in FIGS. 17A and 18, that the load distribution plate 407 does not have the holes, the shear force detection unit 108 may also be used as the pressure measurement unit 102 or contact detection unit 103. In such a case, the load distribution plate 407 may easily be used in both purpose by being switched in time-sharing bases between a case of detecting a shear force and a case of performing pressure detection or contact detection. With this configuration, it may take more data obtaining intervals; however, a compound sensor that is further downsized and can perform a slide since (shear force detection) can be provided.

Here with reference to FIGS. 17A and 17B, description has been given using the configuration of a static capacitance type sensor, which includes a membrane and opposite electrodes and described in the third embodiment; however, the present embodiment is not limited to this example. The present embodiment may be applied to other configurations including the configuration described in the second embodiment.

Seventh Embodiment

A seventh embodiment relates to an arrangement of the distance measurement unit 101. Other arrangements are the same as those in any one of the second to sixth embodiments. The seventh embodiment will be described with reference to FIGS. 19 to 21.

The seventh embodiment is characterized by that the distance measurement unit 101 is provided on the load distribution plate 407.

Figure 19:
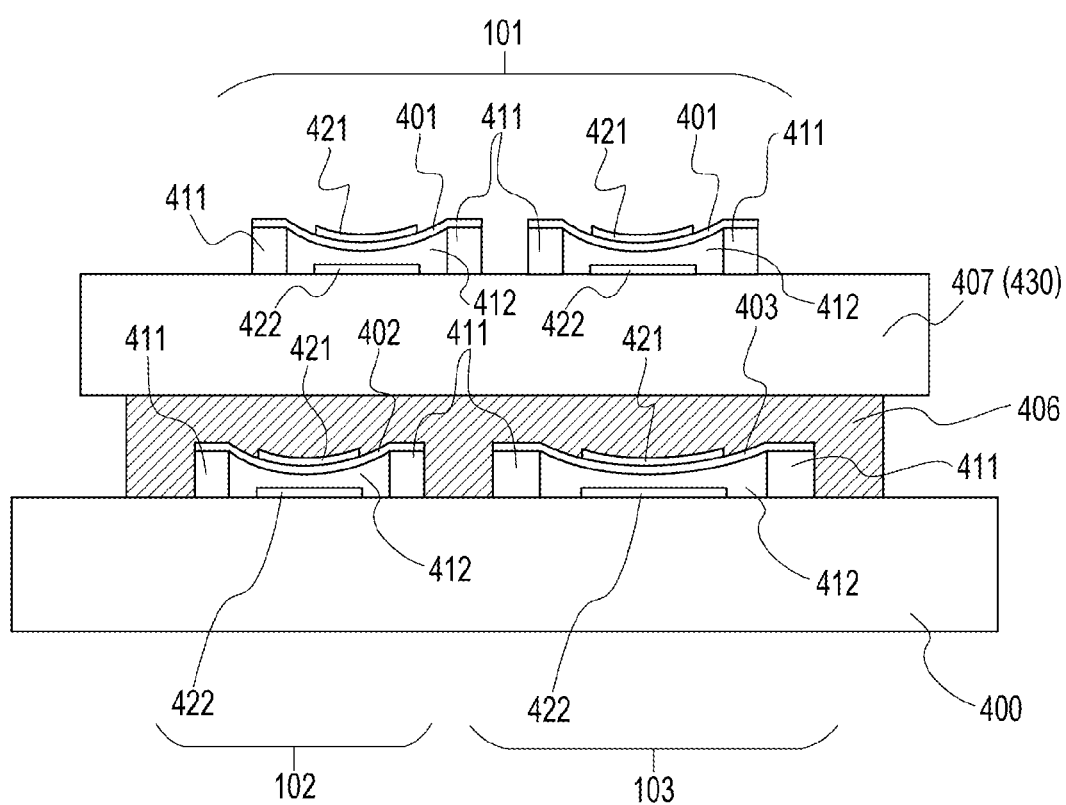
FIG. 19 is a schematic view for explaining a seventh embodiment.
Figure 20:
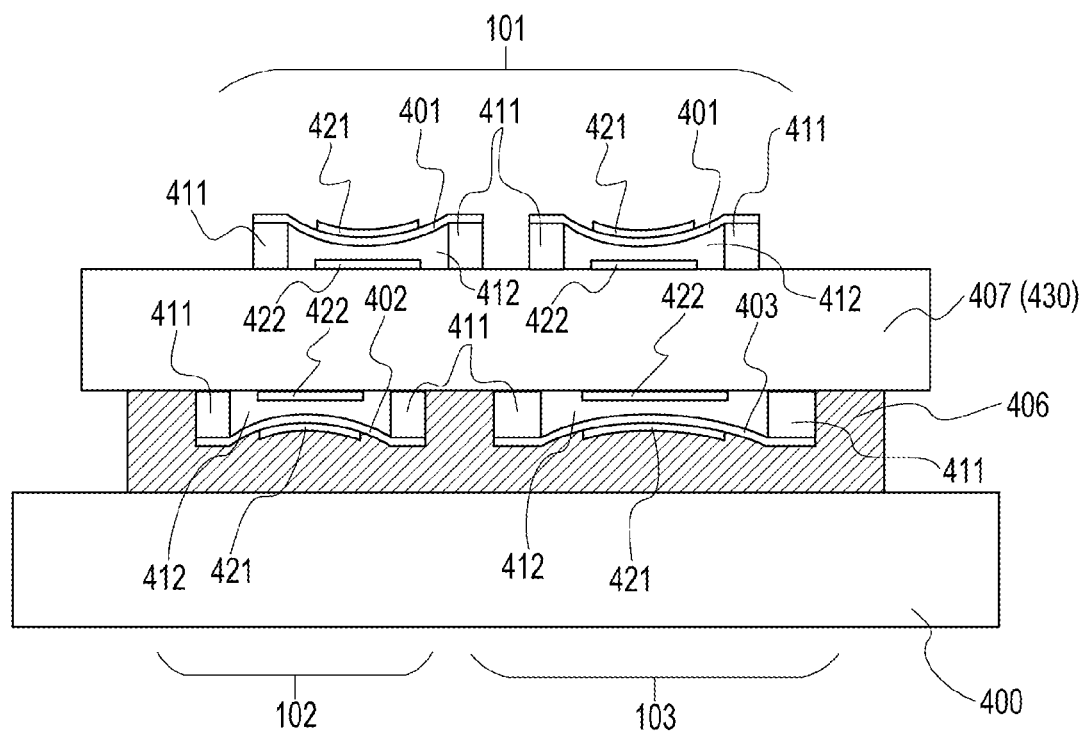
FIG. 20 is a schematic view for explaining the seventh embodiment.
Figure 21:
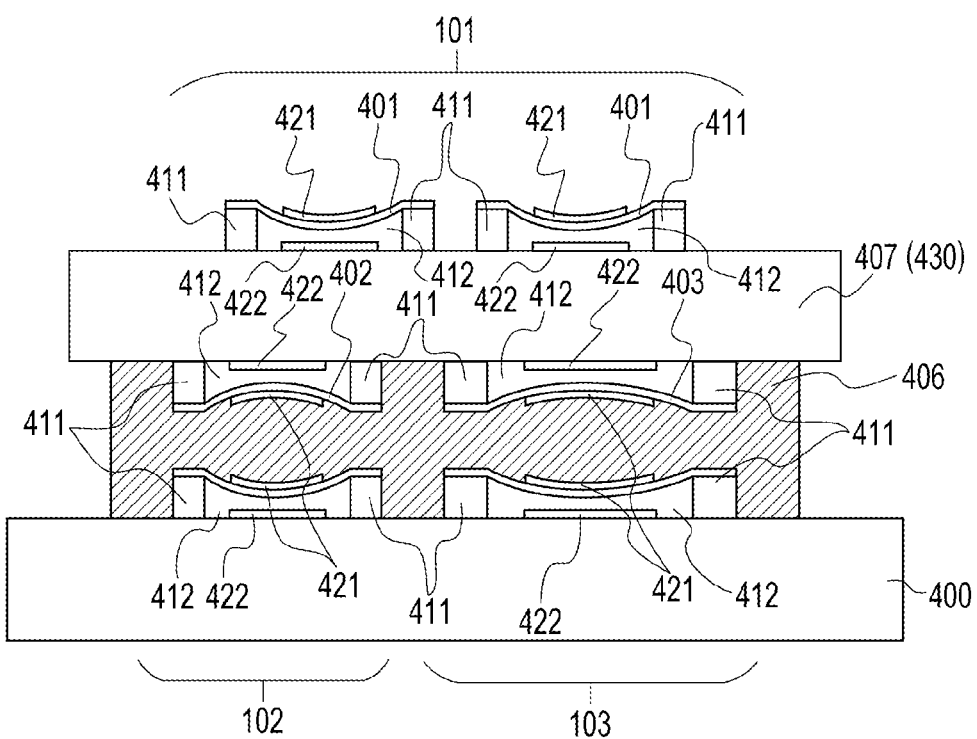
FIG. 21 is a schematic view for explaining the seventh embodiment.

FIGS. 19 to 21 are schematic views for explaining the compound sensor according to the present embodiment. Here, the description will be given with a configuration of the static capacitance type sensor, which is composed of a membrane and opposite electrodes and described in the third embodiment. In these drawings, 430 represents a second substrate.

According to the present embodiment, as illustrated in FIG. 19, a movable second substrate 430 is provided on a fixed substrate (which is referred to as a first substrate, for the sake of simplicity, in the present embodiment) 400 via the elastic body 406. In the configuration according to the present embodiment, the second substrate 430 additionally includes a function as the load distribution plate 407. On a surface opposite to the side facing to the first substrate 400 (in the side of the target 99), the second substrate 430 (load distribution plate 407) is provided with the distance measurement unit 101. In other words, on a first substrate, a second substrate is provided via an elastic body, and the distance measurement unit is provided on a surface of the second substrate opposite to the surface facing to the first substrate. On the other hand, on the first substrate, only the pressure measurement unit 102 and contact detection unit 103 are provided. When the distance from the target 99 is measured, the distance measurement unit 101 on the second substrate 430 transmits and receives ultrasonic waves and the distance is measured. Further, after the target 99 contacts with the surface of the compound sensor 100, since the second substrate 430 serves as the load distribution plate 407, a pressure is applied to the pressure measurement unit 102 and contact detection unit 103 provided on the first substrate 400 so that pressure measurement and contact measurement can be performed.

In the configuration illustrated in FIG. 19, since the distance measurement unit 101 is placed on the second substrate 430, which serves as the load distribution plate 407, an area in which sensors can be placed is nearly twice as that in the configuration including a single substrate. Thus, the sensitivity of each sensor can be improved and a compound sensor that can perform higher-accurate detection can be provided.

Further, since the distance measurement unit 101, which transmits and receives ultrasonic waves is not provided above the pressure measurement unit 102 and contact detection unit 103 via the second substrate 430 therebetween, without being provided on the same surface, transmission signals of the ultrasonic waves and reference signals used in a capacitance detection can be shield. Thus, crosstalk of the signals between the distance measurement unit 101, pressure measurement unit 102, and contact detection unit 103 can be reduced, and a further accurate detection can be performed.

Another example structure of the present embodiment will be described with reference to FIG. 20. In FIG. 20, the pressure measurement unit 102 and contact detection unit 103 are provided on the rear surface (the surface in the side of the first substrate 400) of the second substrate 430. With this, since all the sensors of the three types are provided on the second substrate 430, a signal output line from the sensor or a power supply line to a circuit in the sensor may be simply led from the second substrate 430. Thus, even when the area in which the sensors are provided is enlarged, the leading of the conductive lines can be simplified.

The present embodiment is not limited to the example structures illustrated in FIGS. 19 and 20. As illustrated in FIG. 21, there may be a configuration in which the configurations of FIGS. 19 and 20 are combined. In the configuration illustrated in FIG. 21, since the area where the sensors are provided can be made larger, a further-accurate compound sensor can be provided.

Here, description has been given using the configuration of a static capacitance type sensor, which includes a membrane and opposite electrodes and described in the third embodiment; however, the present embodiment is not limited to this example. The present embodiment may be applied, in the same manner, to other configurations including the configuration described in the second embodiment.

Eighth Embodiment

An eighth embodiment is related to the distance measurement unit 101 and pressure measurement unit 102. Other configurations are the same as those in any one of the first to seventh embodiments. The eighth embodiment will be described with reference to FIGS. 22 to 24.

The eighth embodiment is characterized by that the distance measurement unit 101 and pressure measurement unit 102 are provided as a single unit. In FIGS. 22 to 24, 106 represents a distance/pressure measurement unit, 107 represents a distance/pressure measurement switch unit, 205 represents a distance/pressure measurement switch signal, 206 represents a detection signal, 207 represents a distance/pressure measurement output signal, 440 represents a direct potential application unit, 441 represents a switching unit, 442 represents a distance measurement circuit, 443 represents a pressure measurement circuit, 444 represents a switching unit, 445 represents a switching unit, and 446 represents a superposition unit.

Figure 22:
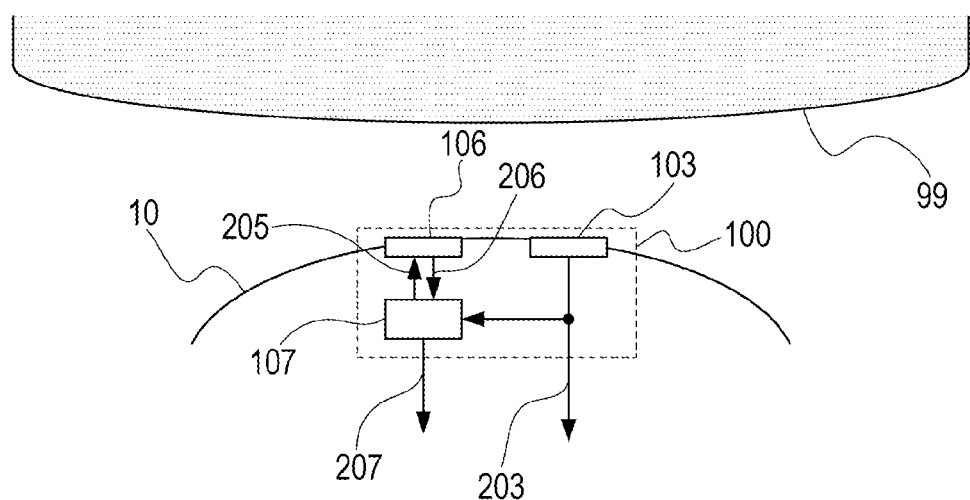
FIG. 22 is a schematic view for explaining an eighth embodiment.

First, FIG. 22 will be explained. The distance/pressure measurement switch unit 107 is composed to select which measurement operation is to be performed based on the contact detection signal 203 output from the contact detection unit 103. More specifically, when the contact detection signal 203 changes from a contact detection to a non-contact detection, a distance measurement operation is performed and, when the contact detection signal 203 changes from a non-contact detection to a contact detection, a pressure measurement operation is performed. With this configuration, it can be judged whether the compound sensor 100 (the end portion of the robot hand 10) is moving to release the target 99 or to hold the target 99.

The distance/pressure measurement unit 106 is composed to detect as a distance detection unit and a pressure measurement unit and performs one of the distance measurement and the pressure measurement after exchanging the drive signal 205 and detection signal 206 with the distance/pressure measurement switch unit 107. More specifically, when distance measurement is performed, the distance is measured by transmitting an ultrasonic wave from the distance/pressure measurement unit 106 and receiving the reflected and returned ultrasonic wave. Further, when pressure measurement is performed, a deformation amount of a membrane in the distance/pressure measurement unit 106 is detected and measured as a pressure.

According to the present embodiment, since the distance measurement unit and pressure measurement unit can be provided as a single unit, a compound sensor including a proximity sense and a tactile sense, which is further downsized and can accurately recognize the contact with the target.

Another example structure of the present embodiment will be described with reference to FIG. 23. Here, the description will be given with a configuration of the static capacitance type sensor, which is composed of a membrane and opposite electrodes and described in the third embodiment. Based on the contact detection signal 203 input to the distance/pressure measurement switch unit 107, the circuit to be connected to the electrode of the membrane in the distance/pressure measurement unit 106 is switched between the distance measurement circuit 442 and pressure measurement circuit 443 by the switching unit 441. The static capacitance type sensor in the distance/pressure measurement unit 106 has the other electrode connected to the direct potential application unit 440, and a direct potential difference Vb is applied between the first electrode and second electrode.

When connected to the distance measurement circuit 442, a drive signal 205 for an ultrasonic wave transmission is applied to the electrode of the membrane, a signal 206 of the ultrasonic wave which is reflected and returned is amplified, and the distance is measured based on the time difference and output as a distance measurement signal 201. On the other hand, when connected to the pressure measurement circuit 443, a signal 206 corresponding to a capacitance from the distance/pressure measurement unit 106 is amplified, converted into a capacitance value, and output as a pressure measurement signal 202. Based on the contact detection signal 203, the switching unit 444 switches which of the respective output signals 201 and 202 is to be output as a distance/pressure measurement output signal 207.

Figure 24:
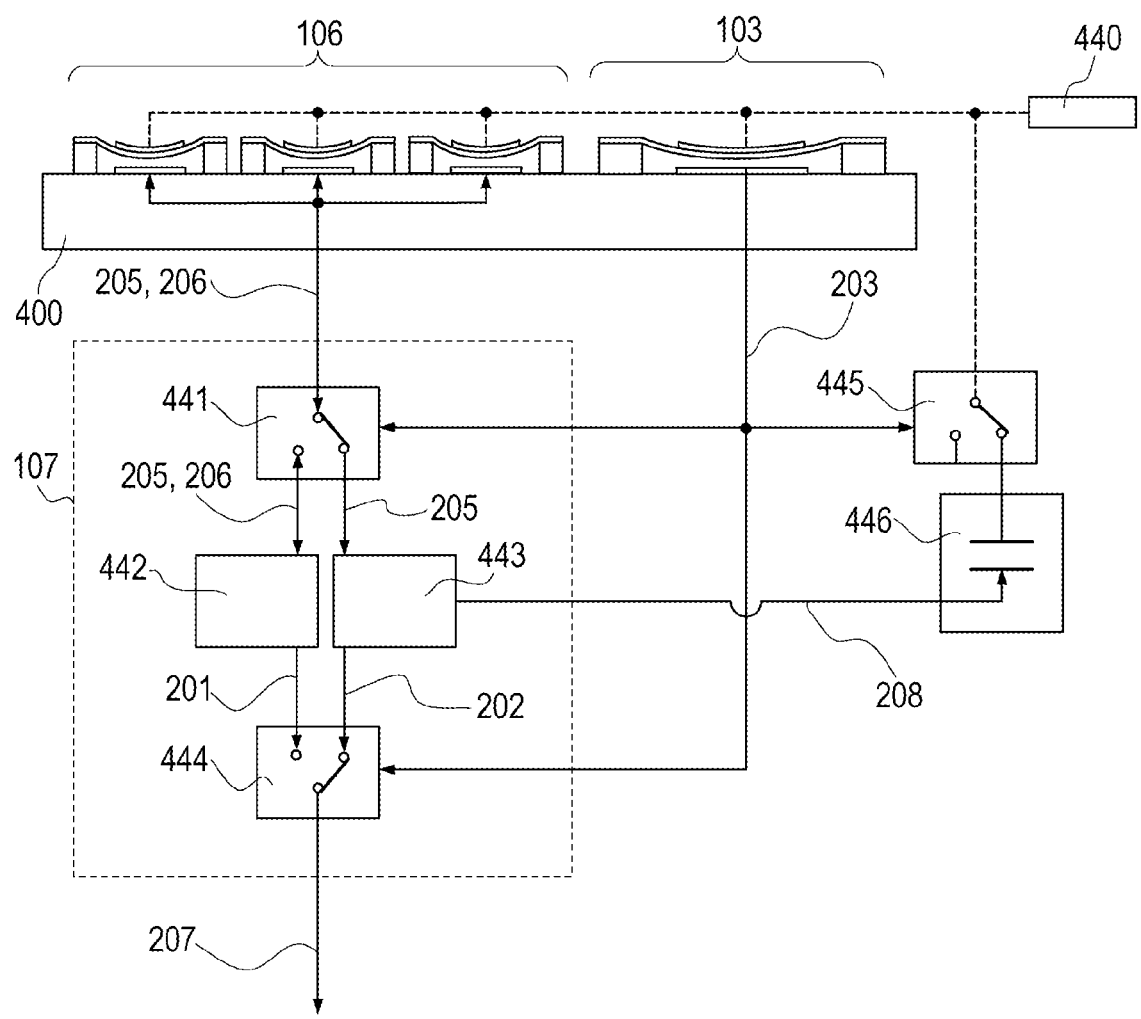
FIG. 24 is a schematic view for explaining the eighth embodiment.

Further, as illustrated in FIG. 24, there may be a configuration that the superposition unit 446 superimposes a reference signal 208 having a frequency which does not vibrate the membrane to the output potential from the direct potential application unit so that the pressure measurement circuit 443 can amplify the signal 206 to be detected. In this case, the pressure measurement circuit 443 can easily extract a signal corresponding to the capacitance value by detecting the detection signal 206 using a frequency of the reference signal 208.

According to the configuration of the present embodiment, since the contact detection unit 103 is provided, the distance measurement unit 101 and pressure measurement unit 102 can be provided as a single unit. This simplifies the configuration of the sensor and a further downsized compound sensor can be provided.

Further, since the distance measurement mode and pressure measurement mode are switched and an ultrasonic wave is not unnecessarily transmitted, the power consumption can be reduced. In addition, the present embodiment has described a configuration to switch the terminals of the circuits 442 and 443; however, the present embodiment is not limited to this configuration and a configuration to stop the operation of the circuits 442 and 443 may be added. With this configuration, a compound sensor of a lower power consumption can be realized.

Figure 23:
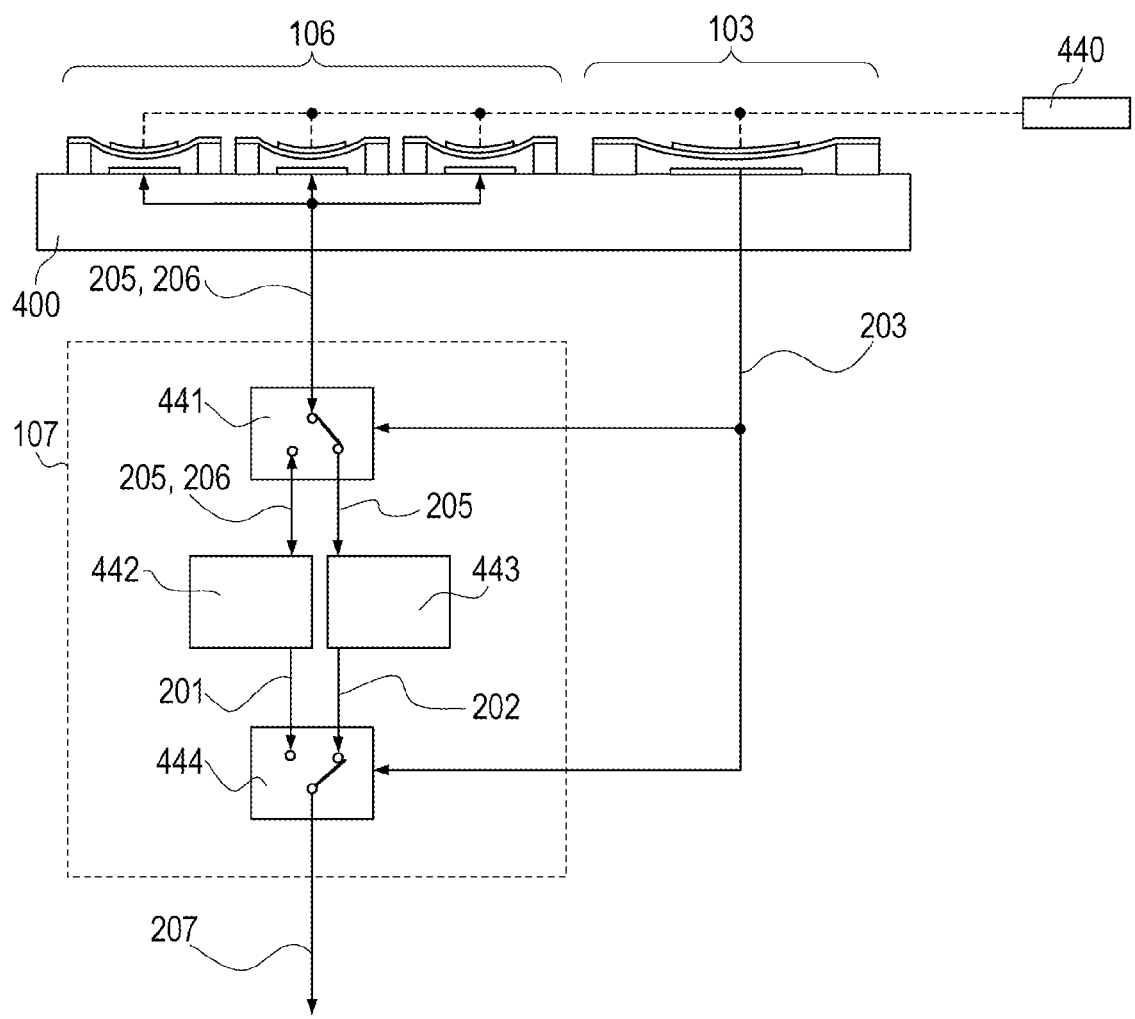
FIG. 23 is a schematic view for explaining the eighth embodiment.

Here with reference to FIG. 23, description has been given using the configuration of a static capacitance type sensor, which includes a membrane and opposite electrodes and described in the third embodiment; however, the present embodiment is not limited to this example. The present embodiment may be applied to other configurations including the configuration described in the second embodiment.

According to the present embodiment, since a contact detection unit that detects a presence of a contact with a measurement target is provided, a compound sensor having a proximity sense and tactile sense that can accurately recognize a contact with the measurement target can be provided.

While the present embodiment has been described with reference to exemplary embodiments, it is to be understood that the embodiment is not limited to the disclosed exemplary embodiments. The scope of the following claims is to be accorded the broadest interpretation so as to encompass all such modifications and equivalent structures and functions.

This application claims the benefit of Japanese Patent Application No. 2017-162617, filed Aug. 25, 2017, which is hereby incorporated by reference herein in its entirety.

What is claimed is:

1. A compound sensor comprising:
a distance measurement unit configured to measure a distance from a measurement target by transmitting an ultrasonic wave and receiving the ultrasonic wave returned from the measurement target;
a pressure measurement unit configured to measure a pressure applied from the measurement target;
a contact detection unit configured to detect a presence of a contact with the measurement target; and
a switching unit configured to switch between measurement by the distance measurement unit and measurement by the pressure measurement unit;
wherein the switching unit performs switching to measure the distance by the distance measurement unit in a case where the contact detection unit detects a change from a state in which the contact with the measurement target is detected to a state in which the contact with the measurement target is not detected, and performs switching to measure the pressure by the pressure measurement unit in a case where the contact detection unit detects a change from a state in which the contact with the measurement target is not detected to a state in which the contact with the measurement target is detected.

2. The compound sensor according to claim 1, wherein a vibrating membrane having a piezoelectric film is included in one or more of the distance measurement unit, the pressure measurement unit, or the contact detection unit.

3. The compound sensor according to claim 1, wherein a vibrating membrane having an electrode and another electrode that faces the electrode is included in one or more of the distance measurement unit, the pressure measurement unit, or the contact detection unit.

4. The compound sensor according to claim 3, wherein one or more of the distance measurement unit, the pressure measurement unit, or the contact detection unit is a static capacitance type sensor.

5. The compound sensor according to claim 1, further comprising
a unit configured to switch between a distance measurement mode in which only the distance measurement unit operates, a pressure detection mode in which the pressure measurement unit operates, and a contact detection mode in which all the distance measurement unit, the pressure measurement unit, and the contact detection unit operate.

6. The compound sensor according to claim 1, further comprising
a shear force detection unit.

7. The compound sensor according to claim 1, wherein on a first substrate, a second substrate is provided via an elastic body, and
the distance measurement unit is provided on a face of the second substrate, which is the face opposite to a face that faces to the first substrate.

8. The compound sensor according to claim 7, wherein the second substrate is provided movable by an external force.

9. The compound sensor according to claim 1, wherein the distance measurement unit and the pressure measurement unit are provided as a single unit.

* * * * *